(12) United States Patent
Fukasawa et al.

(10) Patent No.: US 6,987,054 B2
(45) Date of Patent: Jan. 17, 2006

(54) METHOD OF FABRICATING A SEMICONDUCTOR DEVICE HAVING A GROOVE FORMED IN A RESIN LAYER

(75) Inventors: Norio Fukasawa, Kawasaki (JP);
Hirohisa Matsuki, Kawasaki (JP);
Kenichi Nagashige, Kawasaki (JP);
Yuzo Hamanaka, Kawasaki (JP);
Muneharu Morioka, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 308 days.

(21) Appl. No.: 10/097,817

(22) Filed: Mar. 15, 2002

(65) Prior Publication Data

US 2002/0089054 A1 Jul. 11, 2002

Related U.S. Application Data

(62) Division of application No. 09/160,135, filed on Sep. 25, 1998, now Pat. No. 6,455,920.

(30) Foreign Application Priority Data

Feb. 27, 1998 (JP) .................................. 10-048082

(51) Int. Cl.
*H01L 21/301* (2006.01)
(52) U.S. Cl. ...................... 438/465; 438/460; 438/978; 438/462; 438/114; 438/282; 438/920; 438/542
(58) Field of Classification Search ............... 438/465, 438/460–462, 459, 977, 978, 113, 458, 108, 438/614, 114, 282, 920, 542; 257/618–620, 257/622, 623, 778, 780
See application file for complete search history.

(56) References Cited

U.S. PATENT DOCUMENTS

| | | | |
|---|---|---|---|
| 3,838,501 A | | 10/1974 | Wayne |
| 4,610,079 A | * | 9/1986 | Abe et al. .................... 438/462 |
| 4,814,296 A | * | 3/1989 | Jedlicka et al. ............... 438/68 |
| 4,937,129 A | * | 6/1990 | Yamazaki ................ 428/195.1 |
| 5,152,857 A | | 10/1992 | Ito et al. |
| 5,481,386 A | | 1/1996 | Shimano et al. |
| 6,049,124 A | * | 4/2000 | Raiser et al. ................ 257/712 |
| 6,271,102 B1 | * | 8/2001 | Brouillette et al. ......... 438/462 |

FOREIGN PATENT DOCUMENTS

| | | |
|---|---|---|
| JP | 58079739 | 5/1983 |
| JP | 61-152358 | 7/1986 |
| JP | 63-62679 | 3/1988 |
| JP | 03187242 | 8/1991 |
| JP | 03187242 A * | 8/1991 |
| JP | 04025154 | 1/1992 |
| JP | 05-55278 | 3/1993 |
| JP | 06216241 | 8/1994 |
| JP | 8-66850 | 3/1996 |
| JP | 09097973 | 4/1997 |
| JP | 09219421 | 8/1997 |

(Continued)

*Primary Examiner*—Carl Whitehead, Jr.
*Assistant Examiner*—Yennhu B. Huynh
(74) *Attorney, Agent, or Firm*—Westerman, Hattori, Daniels & Adrian, LLP

(57) ABSTRACT

A semiconductor device has a resin package layer on a principal surface of a semiconductor chip, on which a number of bump electrodes are formed, wherein the semiconductor device has a chamfer surface or a stepped surface on a top edge part such that the external shock or stress applied to such an edge part is dissipated by the chamfer surface of the stepped surface.

10 Claims, 43 Drawing Sheets

FOREIGN PATENT DOCUMENTS

| | | |
|---|---|---|
| JP | 09321181 A | 12/1997 |
| JP | 11-111653 | 4/1999 |
| JP | 11-111896 | 4/1999 |
| JP | 11111896 | 4/1999 |
| JP | 11121647 | 4/1999 |
| JP | 376574 | 12/1999 |

* cited by examiner

FIG. 15A
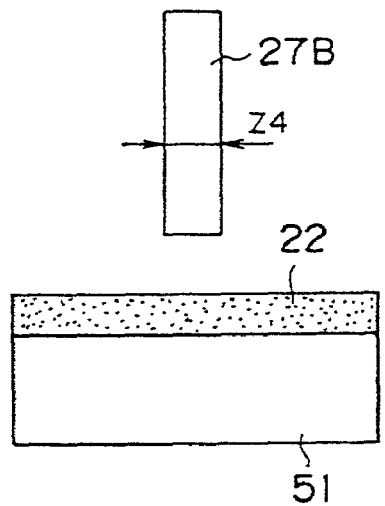
FIG. 15B
FIG. 15C
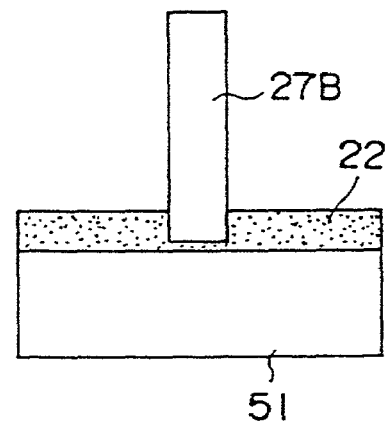
FIG. 15D
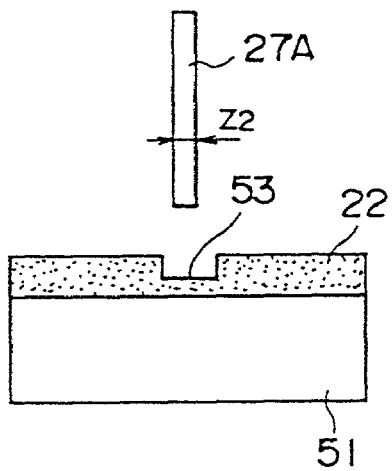
FIG. 15E
FIG. 15F
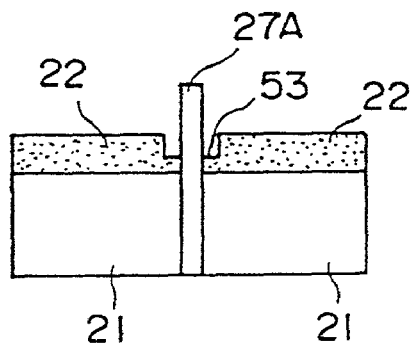

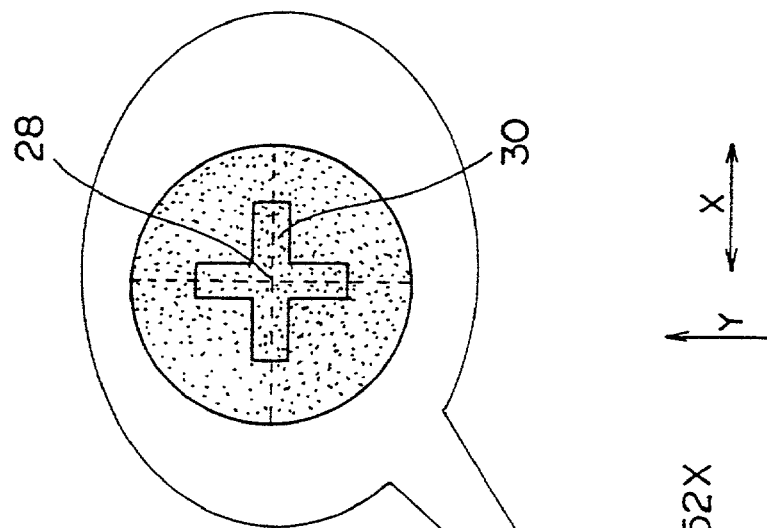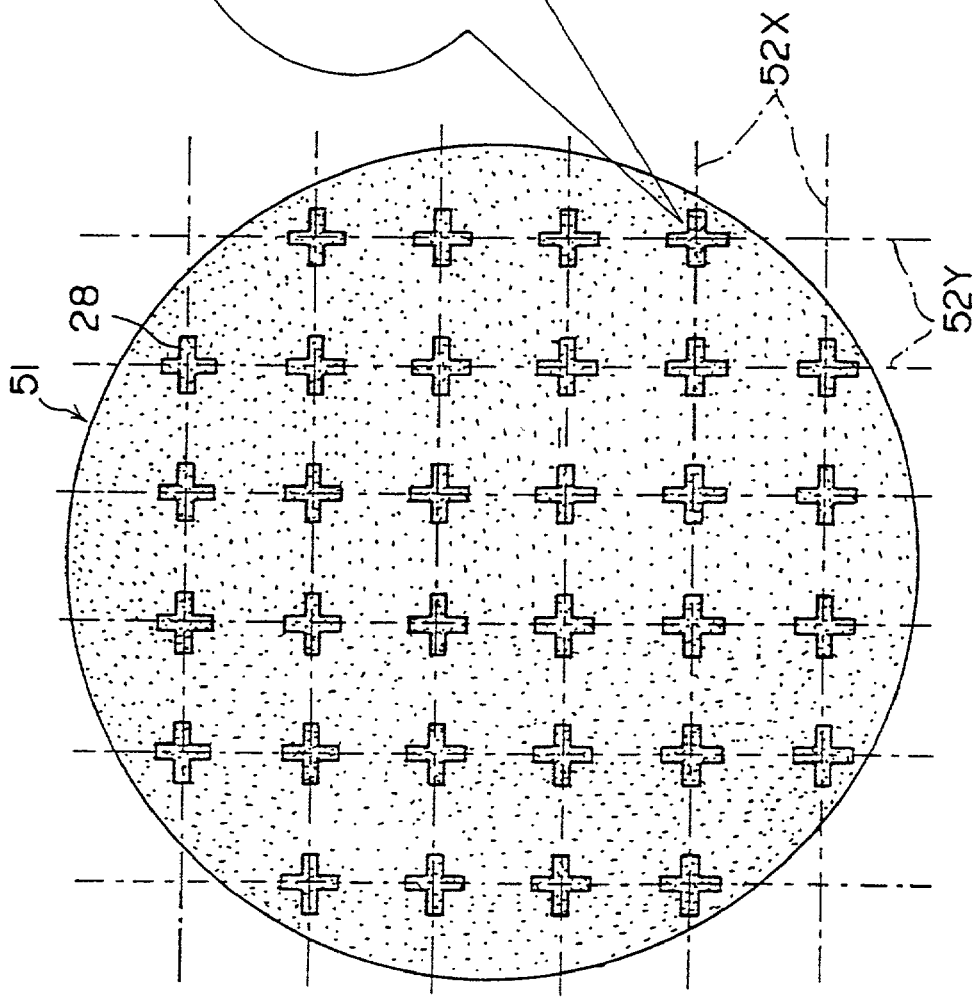

METHOD OF FABRICATING A SEMICONDUCTOR DEVICE HAVING A GROOVE FORMED IN A RESIN LAYER

This application is a division of prior application Ser. No. 09/160,135, filed Sep. 25, 1998 now U.S. Pat. No. 6,455,920.

BACKGROUND OF THE INVENTION

The present invention generally relates to semiconductor devices and more particularly to a semiconductor device having a ball grid array and a fabrication process thereof, including a transportation tray used in the fabrication process of the semiconductor device. Further, the present invention relates to the fabrication process of a semiconductor substrate used for such a semiconductor device.

With ever-increasing demand of size reduction of electronic apparatuses, efforts are being made for decreasing the size and increasing the integration density of semiconductor devices. In relation to this, there is a proposal of a so-called chip-size package structure in which the overall size of the semiconductor device is made close to the size of the semiconductor chip therein.

In order to achieve such a real chip-size package structure, as well as for improving the efficiency of production of the semiconductor devices having such a package structure, there is a proposal of a wafer-level packaging process in which a substrate carrying a plurality of semiconductor devices thereon is subjected to a packaging process in the state that the semiconductor devices are still on the semiconductor substrate, followed by a dicing process to form individual semiconductor chips corresponding to the semiconductor devices.

FIG. 1 shows an example of a semiconductor device 10A fabricated according to a conventional wafer-level packaging process.

Referring to FIG. 1, the semiconductor device 10A generally includes a semiconductor chip 1A, a resin package layer 2 and a plurality of bump electrodes 3.

More specifically, the semiconductor device 10A carries the resin package layer 2 on the surface of the semiconductor chip 1A on which active devices (monolithic electronic circuits) and the bump electrodes 3 are formed. The substrate is then diced into individual semiconductor devices 10A. The semiconductor device 10A thus formed has a size substantially identical to the size of the semiconductor chip 1A.

FIG. 2 shows the construction of a conventional transportation tray 5 used for transporting the semiconductor device 10A of FIG. 1.

Referring to FIG. 2, the transportation tray 5 includes a tray main-body 6 accommodating therein the semiconductor device 10A, and a cap 7 is provided on the train main-body 6 so as to cover the opening of the tray main-body 6. The tray main-body 6 includes a bottom overhang part 8 wherein the bottom overhang part 8 supports the semiconductor device 10A by engaging the resin package layer 2 on the semiconductor chip 1A. The overhang part 8 defines an opening for accommodating the bump electrodes 3 in the state that the semiconductor device 10A is held inside the transportation tray 5.

FIG. 3 shows another conventional semiconductor device 10B fabricated according to a conventional wafer-level packaging process.

Referring to FIG. 3, the semiconductor device 10B generally includes, in addition to the semiconductor chip 1A described in FIG. 1, bump electrodes 4 formed on the semiconductor chip 1A and a circuit substrate 9 provided on the bump electrodes 4 in electrical as well as mechanical connection with the bump electrodes 4, wherein an under-fill resin layer 11 is formed so as to fill the gap between the semiconductor chip 1A and the circuit substrate 9. It should be noted that the bump electrodes 3 forming a ball grid array are formed on the bottom surface of the circuit substrate 9. By using the circuit substrate 9, which carries wiring patterns thereon, a dense array of the bump electrodes 3 becomes possible.

FIG. 4 shows a further conventional semiconductor device 10C fabricated according to a conventional wafer-level packaging process.

Referring to FIG. 4, the semiconductor device 10C has a construction generally identical with the construction of the semiconductor device 10B except that a thin semiconductor chip 1B is used. The semiconductor chip 1B having such a reduced thickness may be formed by grinding the rear surface of the semiconductor chip 1A.

FIGS. 5A–5D are diagrams showing an example of the fabrication process of a conventional semiconductor device.

In recent process of fabricating semiconductor devices, there is a tendency to increase the size of the semiconductor substrate so as to maximize the efficiency of production of the semiconductor devices. In order to obtain such a large-diameter semiconductor substrate, it is necessary to slice a large-diameter semiconductor crystal ingot by a wire saw machine and process the both surfaces of the large-diameter semiconductor wafer thus obtained.

FIG. 5A shows a semiconductor substrate 12A immediately after the sawing process. As can be seen in FIG. 5A, the both surfaces of the semiconductor substrate 12A form a rough surface, and thus, a smoothing process is essential in order that the semiconductor substrate 12A can be used for the substrate of a semiconductor device.

Thus, in the step of FIG. 5B, a hypothetical target surface state 13 is set for the semiconductor substrate 12A, and the rear surface (top surface in the example of FIG. 5B) of the semiconductor substrate 12A is processed in the step of FIG. 5C while using the top surface as a reference surface, such that the state of the rear surface reaches the target surface state 13. Further, the front surface (bottom surface in the example of FIG. 5B) is processed similarly in the step of FIG. 5D. The semiconductor devices 10A, 10B or 10C are formed on such a semiconductor substrate 12A in a row and column formation.

As noted already, the semiconductor device 10A has an advantageous feature in that the desired high-density mounting is possible on a circuit substrate of an electronic apparatus. On the other hand, it should be noted that the semiconductor device 10A has a composite structure 10 in which the semiconductor chip 1A carries a resin layer 2 on the side where the electrode bumps 3 are formed. As the resin layer 2 has a property substantially different from the property of the semiconductor chip 1A or the semiconductor substrate 12C, and in view of the fact that the semiconductor chip 1A, including the resin layer 2 thereon, has a rectangular shape defined by sharply defined edges and corners, there arises a problem, when sawing the semiconductor substrate 12C into the semiconductor chips 1A or when handling the semiconductor device, in that a crack may be formed at the boundary between the semiconductor substrate 12C and the resin layer 2. Alternatively, the semiconductor chip 1A or the resin layer 2 itself may be cracked. The same problem occurs not only in the semiconductor chip 1A but also in the semiconductor chip 1B or 1C.

Further, even in such a case in which the problem of cracking is avoided, the semiconductor device 10A, 10B or 10C is still vulnerable to damages particularly at the boundary between the semiconductor chip 1A and the resin layer 2, and a careful handling is needed in a suitable protective environment.

Further, the use of the transportation tray 5 of FIG.2 in combination with the semiconductor device 10A, 10B or 10C may cause the problem of rattling of the semiconductor device 10A inside the tray main-body 6, while such a rattling is not only disadvantageous in view of poor reliability of transportation but also in view of unreliable contact with a test bed used when testing the semiconductor device 10A in the state that the semiconductor device 10A is held by the transportation tray 5. Further, the rattling of the semiconductor device 10A in the transportation tray 5 may cause a damage in the solder bumps 3 as a result of collision with the bottom overhang part 8 of the transportation tray 5.

In the case of the semiconductor device 10C in which the thickness of the semiconductor chip 1B is reduced, the semiconductor device is extremely fragile and handling of the substrate has to be conducted with an utmost care. This problem becomes particularly serious when a large size substrate is used for increasing the efficiency of production of the semiconductor devices.

Further, the process of forming the semiconductor substrate 12A shown in FIGS. 5A–5D has a drawback in that the substrate 12A tends to show an undulation formed at the time of sawing the semiconductor crystal ingot by a wire saw machine. Such an undulation is difficult to be removed by a mere grinding process conducted by using the surface 13 as a reference surface.

SUMMARY OF THE INVENTION

Accordingly, it is a general object of the present invention to provide a novel and useful semiconductor device and a fabrication process thereof wherein the foregoing problems are eliminated.

Another and more specific object of the present invention is to provide a semiconductor device having a composite wafer-level packaging structure, wherein the problem of cracking of a resin layer covering a semiconductor chip or a crack formation at an interface between the resin layer and the semiconductor chip is successfully avoided.

Another object of the present invention is to provide a semiconductor chip having a top principal surface, said semiconductor chip carrying a plurality of bump electrodes on said top principal surface;

a resin layer covering said top principal surface of said semiconductor chip so as to seal said semiconductor chip, said semiconductor chip and said resin layer thereby forming a composite semiconductor structure defined by a side wall having a plurality of corners, and a chamfer surface formed in said side wall of said composite semiconductor structure as a part of said side wall such that said chamfer surface extends over said semiconductor chip and said resin layer.

Another object of the present invention is to provide a semiconductor device, comprising:

a semiconductor chip having a top principal surface, said semiconductor chip carrying a plurality of bump electrodes on said top principal surface;

a resin layer covering said top principal surface of said semiconductor chip so as to seal said semiconductor chip, said semiconductor chip and said resin layer thereby forming a composite semiconductor structure defined by a side wall having a plurality of corners, and a step surface formed in said resin layer along said side wall of said composite structure.

Another object of the present invention is to provide a semiconductor device, comprising:

a semiconductor chip having a top principal surface, said semiconductor chip carrying a plurality of bump electrodes on said top principal surface;

a resin layer covering said top principal surface of said semiconductor chip so as to seal said semiconductor chip, a chamfer surface formed in a side wall of said semiconductor chip as a part of said side wall such that said chamfer-surface surrounds said semiconductor chip along a top edge thereof, said resin layer covering said chamfer surface.

Another object of the present invention is to provide a method of fabricating a semiconductor device, comprising the steps of:

forming a resin layer on a principal surface of a semiconductor substrate;

grooving said resin layer along a dicing line on said semiconductor substrate to form a V-shaped groove having a substantially V-shaped cross-section such that said V-shaped groove reaches said semiconductor substrate; and dicing, after said step of grooving, said semiconductor substrate along said V-shaped groove by forming a dicing groove with a width smaller than a width of said V-shaped groove.

Another object of the present invention is to provide a method of fabricating a semiconductor device, comprising the steps of:

forming a resin layer on a principal surface of a semiconductor substrate;

dicing said semiconductor substrate along a dicing line by forming a dicing groove through said resin layer and through said semiconductor substrate; and grooving, after said step of dicing of said semiconductor substrate, said resin layer along said dicing line to form a V-shaped groove having a substantially V-shaped cross-section in said resin layer such that said V-shaped groove has a width larger than a width of said dicing groove and reaches said semiconductor substrate.

Another object of the present invention is to provide a method of fabricating a semiconductor device, comprising the steps of:

forming a resin layer on a principal surface of a semiconductor substrate;

grooving said resin layer along a dicing line on said semiconductor substrate to form a first groove having a substantially rectangular cross-section and a first width in said resin layer; and dicing, after said step of grooving, said semiconductor substrate along said first groove by forming a second groove with a second width smaller than said first width of said first groove.

Another object of the present invention is to provide a method of fabricating a semiconductor device, comprising the step of:

adhering a semiconductor substrate on a dicing apparatus by an adhesive tape;

dicing said semiconductor substrate in a first direction such that said adhesive tape remains substantially intact;

dicing said semiconductor substrate in a second, different direction together with said adhesive tape, to form a plurality of adhesive strips each carrying thereon a plurality of semiconductor chips aligned in a row; and applying a V-shaped saw blade having a V-shaped saw edge laterally to each of said adhesive strips such that said V-shaped saw blade cuts into a gap formed between a pair of adjacent semiconductor chips by said dicing step conducted in said first direction, said saw blade thereby forming a chamfer surface on a side wall of said semiconductor chips such that said chamfer surface extends, in each of said semiconductor chips, generally perpendicularly to a principal surface of said semiconductor chip.

Another object of the present invention is to provide a method of fabricating a semiconductor device, comprising the steps of:

forming a V-shaped groove on a top surface of a semiconductor substrate, said semiconductor device carrying an electronic circuit on said top surface;

forming a resin layer on said top surface of said semiconductor substrate so as to fill said V-shaped groove; and dicing said semiconductor substrate by a dicing saw having a blade width smaller than a width of said V-shaped groove, along said V-shaped groove.

According to the present invention, the composite semiconductor body forming the semiconductor device becomes substantially immune to damages caused by a shock or concentration of stress, as the composite semiconductor structure effectively dissipates the stress or shock applied thereto, particularly to the corner of the composite semiconductor structure.

Another object of the present invention is to provide a method of fabricating a semiconductor device, comprising the steps of:

slicing a semiconductor substrate from a semiconductor ingot;

applying a resin layer on a first surface of said semiconductor substrate such that said resin layer has a planarized surface;

grinding a second surface of said semiconductor substrate while using said planarized surface of said resin layer as a reference surface, to form a planarized surface on said second surface; and grinding said first surface while using said second, planarized surface as a reference surface, to form a planarized surface on said first surface.

According to the present invention, a semiconductor substrate having a smooth and flat surface suitable for construction of semiconductor devices thereon is obtained.

Another object of the present invention is to provide a transportation device of a semiconductor device, comprising:

a tray member adapted to support a semiconductor device in a face-down state, said semiconductor device carrying a plurality of bump electrodes thereon, said tray member having an opening for accommodating said bump electrodes when said semiconductor device is mounted on said tray member; and a removable cap member provided on said tray member removably, said removable cap member covering said tray member in a state in which said semiconductor device is mounted on said tray member, wherein said tray member includes a chamfer surface for engagement with a corresponding chamfer surface formed on said semiconductor device.

Another object of the present invention is to provide a transportation device of a semiconductor device, comprising:

a tray member adapted to support a semiconductor device in a face-down state, said semiconductor device carrying a plurality of bump electrodes thereon, said tray member having an opening for accommodating said bump electrodes when said semiconductor device is mounted on said tray member; and a removable cap member provided on said tray member removably, said removable cap member covering said tray member in a state in which said semiconductor device is mounted on said tray member, wherein said tray member includes a step surface for engagement with a corresponding step surface formed on said semiconductor device.

Another object of the present invention is to provide a method of fabricating a semiconductor device, comprising the steps of:

mounting a semiconductor device having a chamfered surface and a plurality of bump electrodes on a transportation device, said transportation device comprising a tray member adapted to support said semiconductor device in a face-down state, said tray member having an opening for accommodating said bump electrodes when said semiconductor device is mounted on said tray member, and a removable cap member provided on said tray member removably, said removable cap member covering said tray member in a state in which said semiconductor device is mounted on said tray member, said tray member including a chamfer surface for engagement with said chamfer surface on said semiconductor device; and transporting said semiconductor device in a state mounted on said transportation device.

Another object of the present invention is to provide a method of fabricating a semiconductor device, comprising the steps of:

mounting a semiconductor device having a stepped surface and a plurality of bump electrodes on a transportation device, said transportation device comprising a tray member adapted to support said semiconductor device in a face-down state, said tray member having an opening for accommodating said bump electrodes when said semiconductor device is mounted on said tray member, and a removable cap member provided on said tray member removably, said removable cap member covering said tray member in a state in which said semiconductor device is mounted on said tray member, said tray member including a stepped surface for engagement with said stepped surface on said semiconductor device; and transporting said semiconductor device in a state mounted on said transportation device.

According to the present invention, the semiconductor device is positioned spontaneously to the desired nominal position inside the transportation tray with little rattling as a result of the engagement of the chamfered surfaces or the stepped surfaces. Thereby, the transportation of the semiconductor device is conducted reliably including the test process that is conducted while in the state the semiconductor device is held in the transportation tray.

Other objects and further features of the present invention will become apparent from the following detailed description when read in conjunction with the attache drawings.

BRIEF DESCRIPTION OF THE DRAWINGS

FIGS. 15A–15F are diagrams showing the fabrication process of a semiconductor device according to a ninth embodiment of the present invention;

FIGS. 16A and 16B are diagrams showing the fabrication process of a semiconductor device according to a tenth embodiment of the present invention;

DETAILED DESCRIPTION OF THE PREFERRED EMBODIMENTS

[First Embodiment]

Figure 6A:
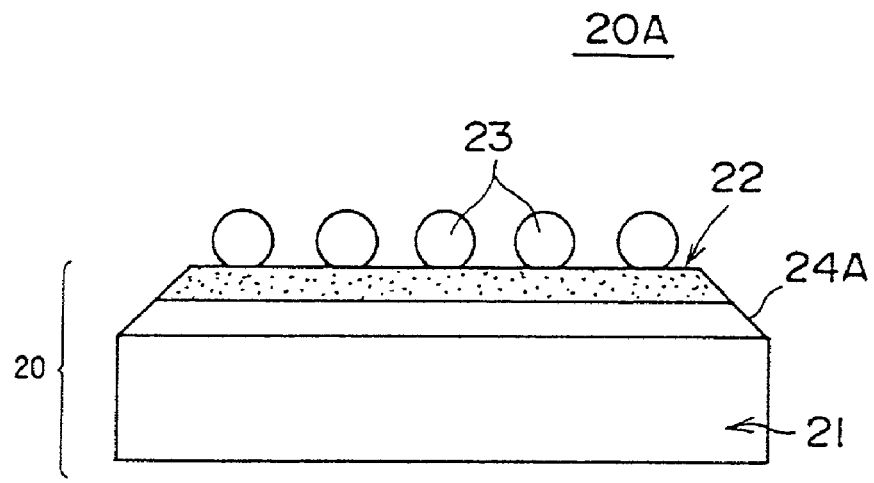
FIGS. 6A and 6B are diagrams showing the construction of a semiconductor device according to a first embodiment of the present invention.
Figure 6B:
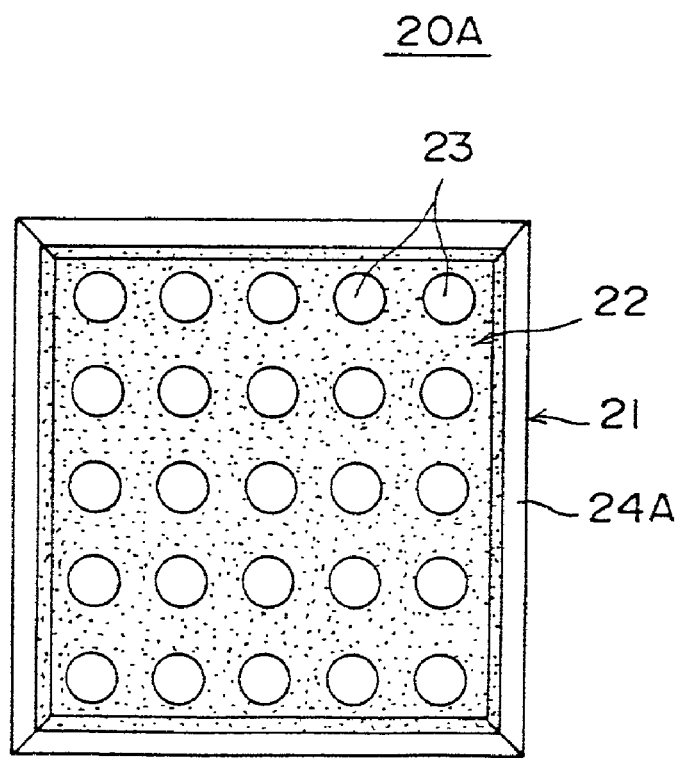

FIGS. 6A and 6B show the construction of a semiconductor device 20A according to a first embodiment of the present invention wherein FIG. 6A shows the semiconductor device in a side view while FIG. 6B shows the semiconductor device in a plan view.

Referring to FIGS. 6A and 6B, the semiconductor device 20A has a composite structure 20 including a semiconductor chip, bump electrodes 23 formed on a top surface of the semiconductor chip 20A and a resin layer 22 provided on the top surface of the semiconductor device 20A, wherein the semiconductor chip 20A carries an integrated solid-state electronic circuit (not shown) on the foregoing top surface as a monolithic part of the semiconductor chip 20A. Thereby, the bump electrodes 23 are formed on the foregoing top surface in electrical as well as mechanical connection with an electrode pad of the foregoing integrated solid-state electronic circuit. Typically the bump electrodes 23 are formed of solder balls and act as an external connection terminal of the electronic circuit.

The resin layer 22 seals the foregoing top surface of the semiconductor chip 21 including the electronic circuit thereon and may be formed of a thermosetting resin such as polyimide or epoxy. The resin layer 22 is provided so as to cover the entire top surface of the semiconductor chip 21, and the bump electrodes 23 project from the resin layer 22, exposing thereby the tip ends thereof.

It should be noted that the composite structure 20 forming the semiconductor device 20A has a rectangular form defined by a surrounding side wall as can be seen in the plan view of FIG. 6B, wherein the side wall is formed with a chamfer surface 24A such that the chamfer surface 24A cuts the resin layer 22 and the semiconductor chip 21 obliquely and continuously.

The semiconductor device 20A thus formed has a size substantially identical with the size of the semiconductor chip 21. In other words, the semiconductor device 20A has a so-called chip-size package structure suitable for size reduction.

As noted already, the resin layer 22 seals the semiconductor chip 21 in the semiconductor device 20A, including the bottom part of the bump electrodes 23. Thereby, the resin layer 22 protects the bump electrodes 23 similarly to a conventional under-fill resin, and the problem of damages to the bump electrodes 23 is successfully avoided even in such a case in which the semiconductor device 20A is mounted on an external mount substrate such as a printed circuit board.

In the semiconductor device 20A, the chamfer surface 24A is formed on the top edge of the composite structure 20 along the side wall as noted before. Thereby, the chamfer surface 24A successfully dissipates the shock or stress applied thereto, and the problem of stress concentration to such a sharp edge of the composite structure 20 is successfully avoided. It should be noted that such a top edge of the semiconductor structure has been particularly vulnerable to external shock or stress in the conventional structure 10A of FIG. 1. As the semiconductor device 20A is thus immune to damages, which may be caused at the time of handling the semiconductor device or at the time of transporting the device. As the monolithic electronic circuit in the semiconductor device 20A is protected by the resin layer 22, the semiconductor device 20A operates stably in various environments such as high temperature environment or low temperature environment.

In the embodiment of FIGS. 6A and 6B, the chamfer surface 24 is formed so as to cut or cross the resin layer 22 and the semiconductor chip 21 as noted already. However, such a construction is not mandatory in view of the foregoing mechanism of the chamfer surface 24 and the chamfer surface 24 may be formed only in the resin layer 22. Further, the chamfer surface 24A is not limited to a single flat surface but may be a curved surface or formed of a plurality of flat surfaces. Further, any structure effective for dissipating stress may be used for the chamfer surface 24 of the present embodiment.

[Second Embodiment]

Figure 7A:
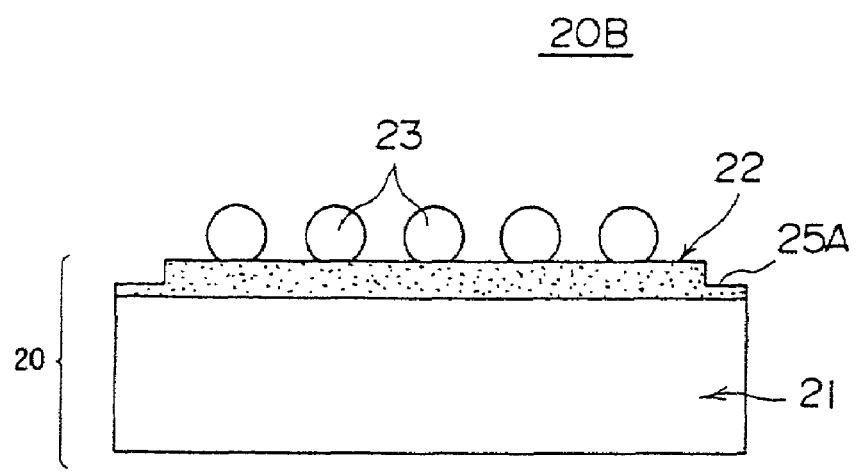
FIGS. 7A and 7B are diagrams showing the construction of a semiconductor device according to a second embodiment of the present invention.
Figure 7B:
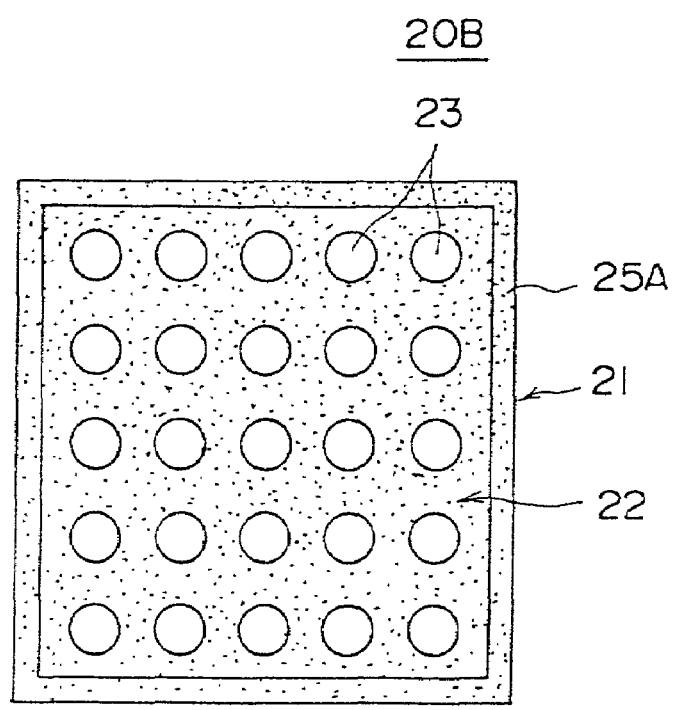

FIGS. 7A and 7B show the construction of a semiconductor device 20B according to a second embodiment of the present invention wherein FIG. 7A shows the semiconductor device 20B in a side view while FIG. 7B shows the semiconductor device 20B in a plan view. In FIGS. 7A and 7B, those parts corresponding to the parts described previously are designated by the same reference numerals and the description thereof will be omitted.

Referring to FIGS. 7A and 7B, the semiconductor device 20B includes a stepped structure 25A in the resin layer 22 covering the semiconductor chip 21 such that the stepped structure 25A extends around the top edge of the composite structure 20 of the semiconductor device 20B. In the illustrated example, the stepped structure 25A includes a single step surface, while the stepped structure 25A of the present embodiment is never limited to such a particular construction but may includes a plurality of stepped surfaces or one or more curved stepped surfaces.

By forming the stepped structure 25A around the top edge of the composite structure 20 of the semiconductor device 20B, it is possible to dissipate external shock or stress applied to the semiconductor device 20B and the handling or transportation of the semiconductor device 20B is facilitated substantially.

[Third Embodiment]

Figure 8A:
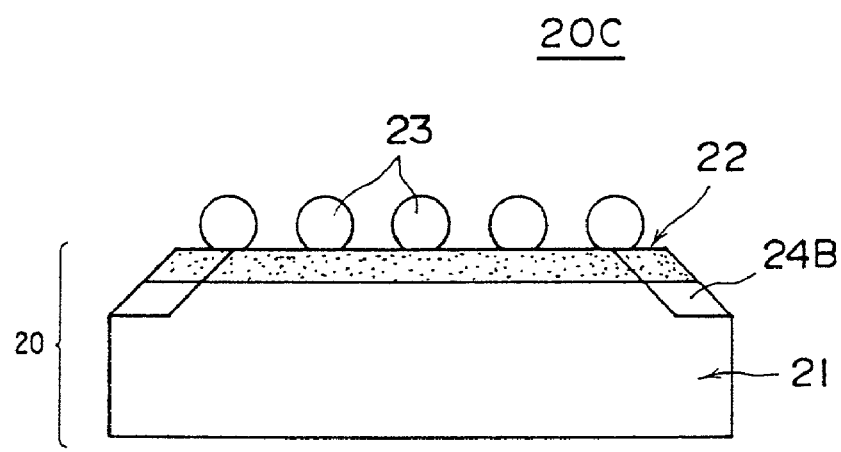
FIGS. 8A and 8B are diagrams showing the construction of a semiconductor device according to a third embodiment of the present invention.
Figure 8B:
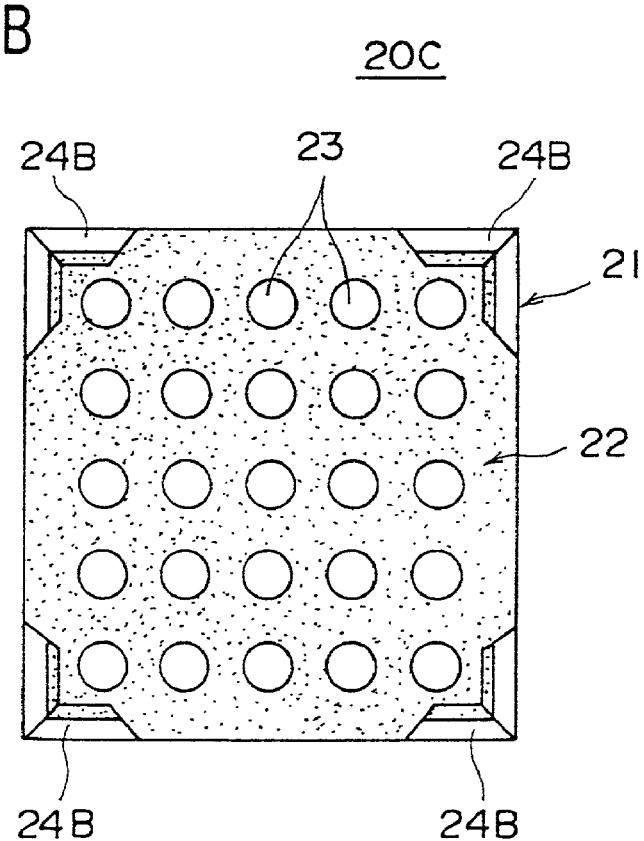

FIGS. 8A and 8B show the construction of a semiconductor device 20C according to a third embodiment of the present invention, wherein FIG. 8A shows the semiconductor device 20C in a side view while FIG. 8B shows the semiconductor device 20C in a plan view. In FIGS. 8A and 8B, those parts corresponding to the parts described previously are designated by the same reference numerals and the description thereof will be omitted.

Referring to FIGS. 8A and 8B, it should be noted that the semiconductor device 20C carries a chamfer surface 20B on each of four corners of the composite structure 20 forming the semiconductor device 20C, such that the chamfer surface 20B cuts or crosses the resin layer 22 and further the underlying semiconductor chip 21 obliquely in each corner of the composite structure 20.

By forming the chamfer surfaces 20B as such, the problem of concentration or shock is successfully avoided in the four corners which are particularly vulnerable to damages. Thereby, the handling and transportation of the semiconductor device 20B is substantially facilitated. As the monolithic electronic circuit on the top surface of the semiconductor device 20B is protected by the resin layer 22, the semiconductor operates stably in various operational environments.

In the semiconductor device 20B of the present embodiment, it is also possible to form the chamfer surfaces 24B such that the chamfer surfaces 24B cut-in or cross only the resin layer 22.

[Fourth Embodiment]

Figure 9A:
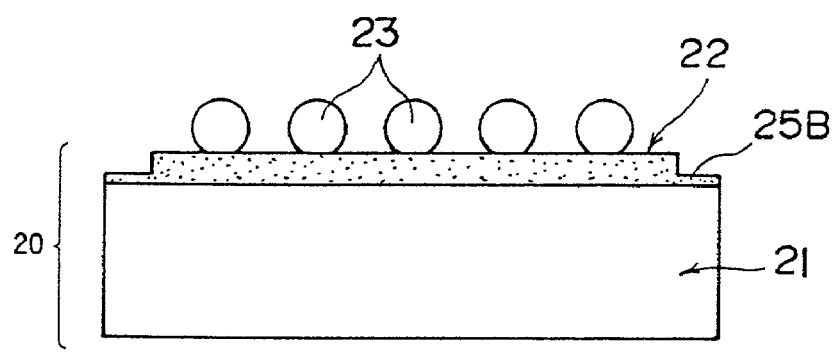
FIGS. 9A and 9B are diagrams showing the construction of a semiconductor device according to a fourth embodiment of the present invention.
Figure 9B:
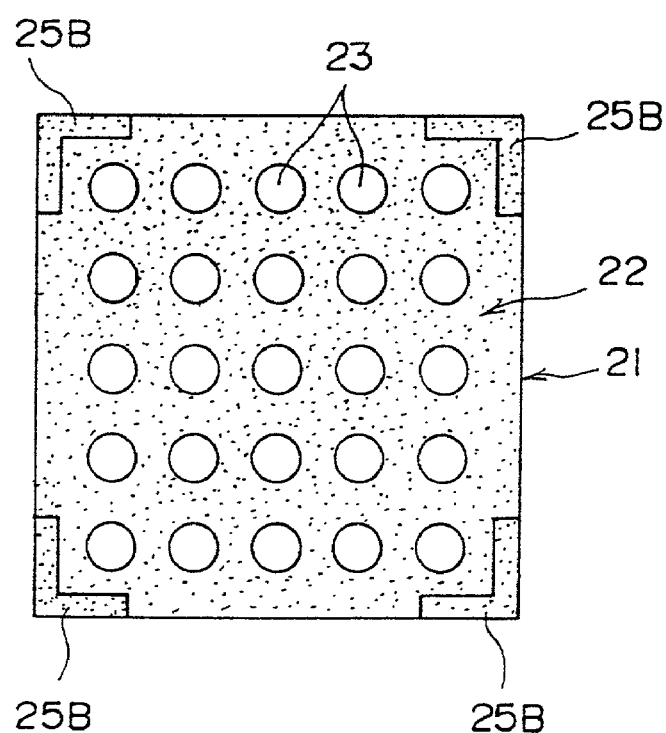

FIGS. 9A and 9B show a semiconductor device 20D according to a fourth embodiment of the present invention respectively in a side view and a plan view, wherein those parts corresponding to the parts described previously are designated by the same reference numerals and the description thereof will be omitted.

Referring to FIGS. 9A and 9B, the semiconductor device 20D includes a stepped part 25B in the resin layer 22 in each of the four corners of the composite structure 20 forming the semiconductor device 20D.

By forming the stepped parts 25B in the resin layer 22 as such, the problem of concentration of shock or stress to the corners-of the composite structure 20 is successfully avoided and the handling and transportation of the semiconductor device 20D are facilitated substantially. AS the monolithic electronic circuits on the top surface of the semiconductor chip 21 is sealed by the resin layer 22, the semiconductor device 20D operates stably in various operational environments.

It should be noted that the stepped part 25B of the present embodiment is not limited to a single step surface shown in FIG. 9A but may include a plurality of stepped surfaces. Further, the stepped surface forming the stepped part 25B is not limited to a flat surface but may-be a curved surface.

[Fifth Embodiment]

Next, the fabrication process of the semiconductor device 20A according to a fifth embodiment of the present invention will be described with reference to FIGS. 10A–10F.

Figure 10A:
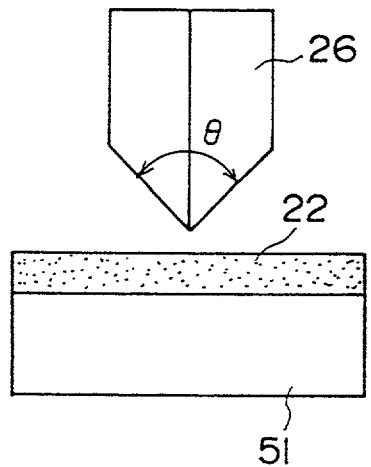
FIGS. 10A–10F are diagrams showing the fabrication process of a semiconductor device according to a fifth embodiment of the present invention.

Referring to FIG. 10A, a number of monolithic electronic circuits (not shown) are formed on a semiconductor wafer 51 in correspondence to individual semiconductor integrated circuits to be formed, and the wafer 51 is covered by the resin layer 22 after formation of the bump electrodes 23 in correspondence to each of the semiconductor integrated circuits, such that the bump electrodes 23 project beyond the resin layer 22.

Figure 10D:
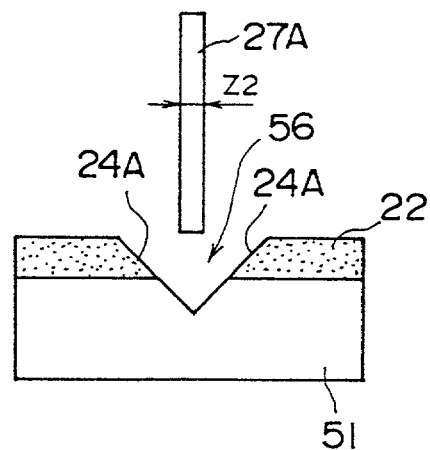
Figure 10B:
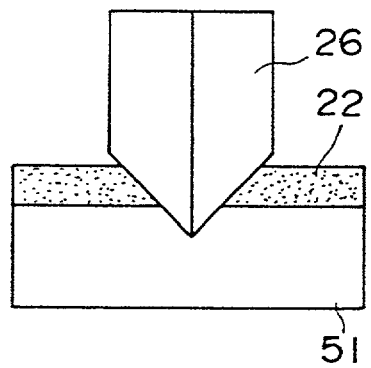

Next, in the step of FIG. 10B, a saw blade 26 having a V-shaped cutting edge of an edge angle θ is applied to the resin layer 22 such that the saw blade 26 cuts into the semiconductor wafer 51 through the resin layer 22. As a result of the grooving process of FIG. 10B, a V-shaped groove 56 is formed such that the groove 56 is defined by a pair of surfaces corresponding to the chamfer surface 24A of the semiconductor device 20A. In the state of FIG. 10C, the V-shaped groove 56 cuts into the semiconductor wafer 51 with a depth $z_1$.

Figure 10E:
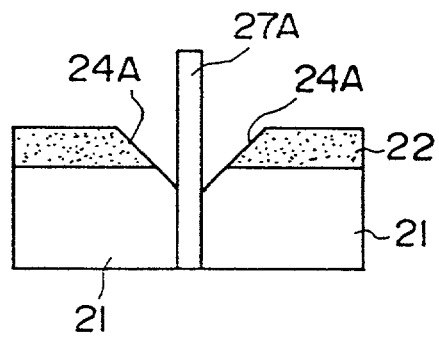
Figure 10C:
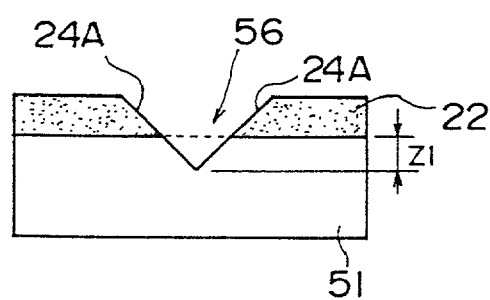
Figure 10F:
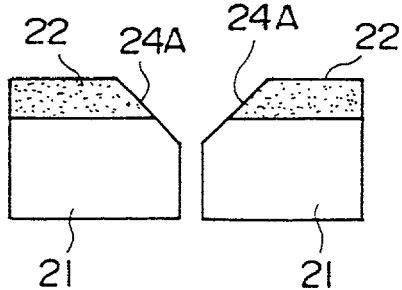

Next, a saw blade 27A having a width $z_2$ and a flat cutting edge surface shown in FIG. 10D is applied to the foregoing V-shaped groove 56 in alignment with the center of the groove 56 as indicated in FIG. 10E, and the wafer 51 is diced into the semiconductor chips 21 as indicated in FIG. 10F.

According to the present embodiment, the saw blade 27A acts directly on the wafer 51 exposed by the groove 56, and the efficiency of dicing of the wafer 51 is improved substantially as compared with the case in which the saw blade 27A cuts into the semiconductor wafer 51 through the resin layer as in the case of forming the conventional semiconductor device 10A. Associated with this, the problem of damaging of the semiconductor chip 21 or the resin layer 22, which tends to occur when cutting a structure in which a resin layer is formed on a semiconductor substrate by a saw blade, is successfully eliminated. As a result of the process of FIGS. 10A–10F, the semiconductor devices 20A each carrying the chamfer surface 24A on the top edge part thereof are mass produced efficiently.

[Sixth Embodiment]

FIGS. 11A–11F show another fabrication process of the semiconductor device 20A according to a sixth embodiment of the present invention.

Figure 11A:
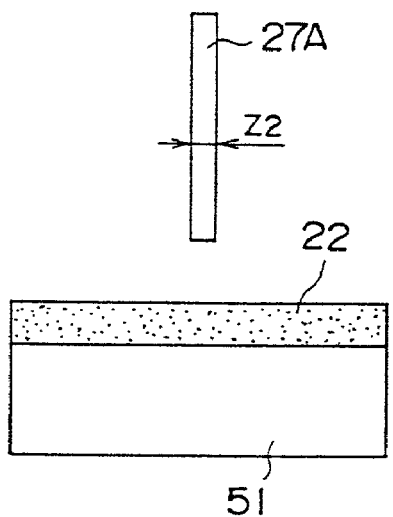
FIGS. 11A–11F are diagrams showing the fabrication process of a semiconductor device according to a sixth embodiment of the present invention.
Figure 11B:
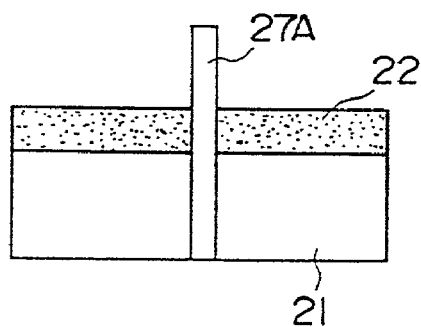
Figure 11C:
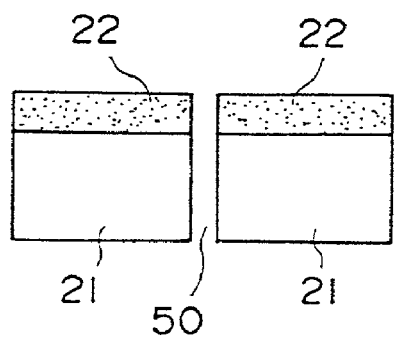

Referring to FIGS. 11A–11F, the saw blade 27A explained with reference to FIG. 10D is applied to the resin layer 22 covering the semiconductor wafer 51 in the step of FIG. 11A such that the wafer 51 is divided to form the semiconductor chips 21, wherein the semiconductor wafer 51 is adhered to a dicing stage not illustrated in the step of FIG. 11B, and thus, the semiconductor chips 21 formed as a result of the dicing process maintain the position thereof as indicated in FIG. 11C, with a dicing groove 50 formed between adjacent semiconductor chips 21.

Figure 11D:
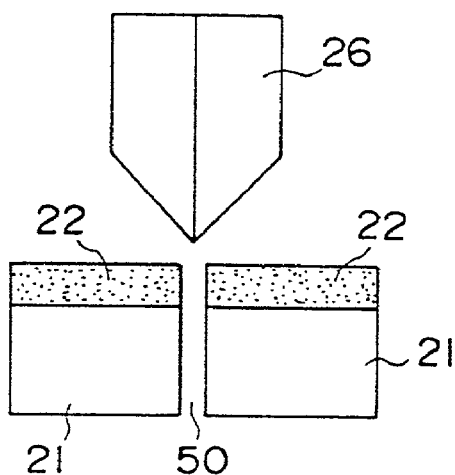
Figure 11E:
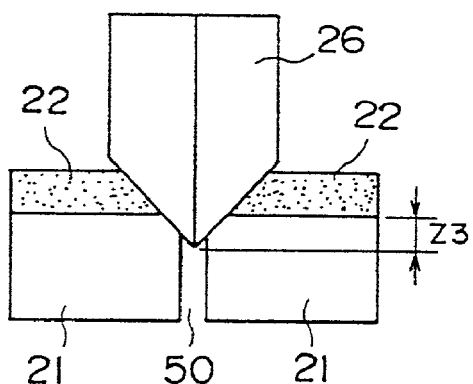
Figure 11F:
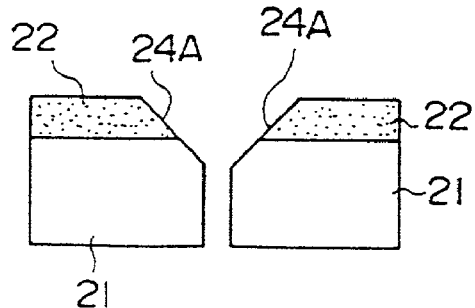

Next, in the step of FIG. 11D, the saw blade 26 explained with reference to FIG. 10A is applied to the structure of FIG. 11C in alignment with the dicing groove 50 such that the saw blade 26 cuts the semiconductor chips 21 with a depth $z_3$ as indicated in FIG. 11E. As a result of the process of FIG. 11E, the chamfer surface 24A is formed on the top edge part of the composite structure 20 of the semiconductor chip 21 and the resist layer 22 as indicated in FIG. 11F.

According to the process of FIGS. 11A–11E, in which the grinding process of FIG. 11E conducted by the saw blade 26 after the dicing process of FIG. 11D, the problem of wear of the V-shaped saw blade 26 is avoided successfully, by grinding along the dicing line 50 already formed. As a result of the process of FIGS. 11A–11F, the semiconductor devices 20A each carrying the chamfer surface 24A on the top edge part thereof are mass produced efficiently.

[Seventh Embodiment]

Figure 12B:
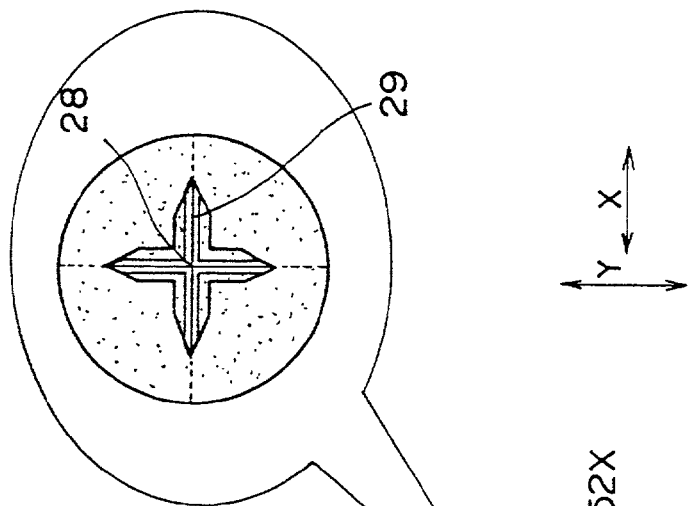
FIGS. 12A and 12B are diagrams showing the fabrication process of a semiconductor device according to a seventh embodiment of the present invention.
Figure 12A:
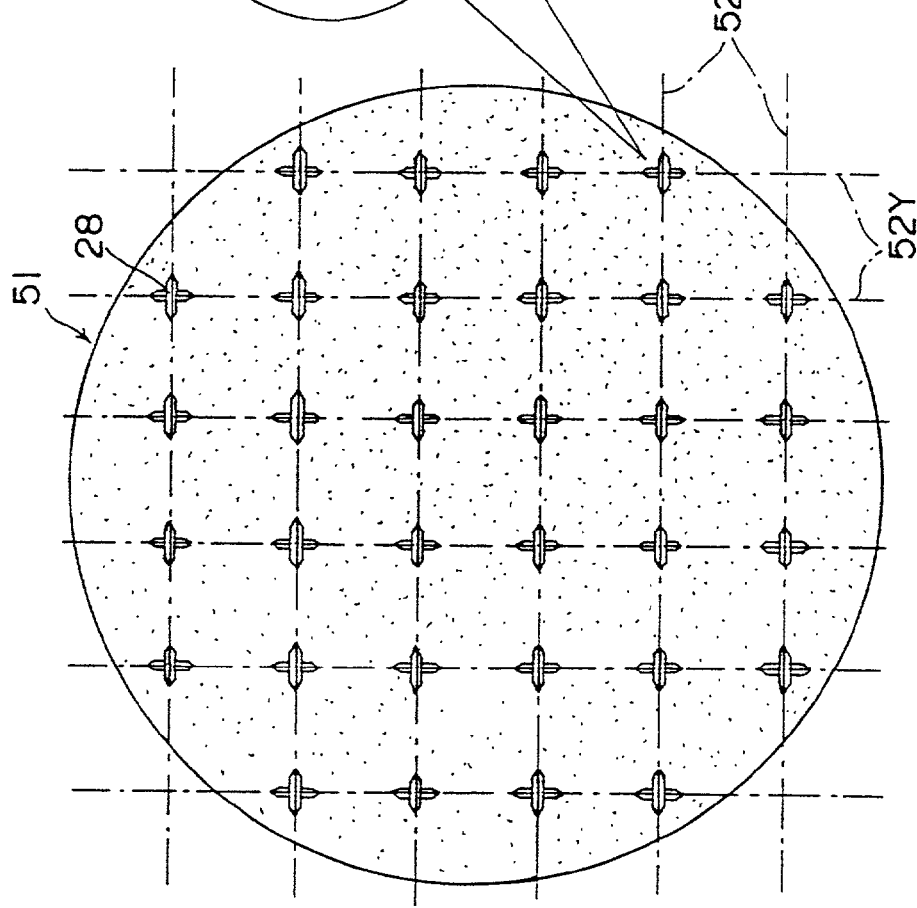

FIGS. 12A and 12B show the fabrication process of the semiconductor device 20C described previously, according to a seventh embodiment of the present invention.

Referring to FIGS. 12A and 12B showing the semiconductor wafer 51 in a plan view, the V-shaped saw blade 26 described previously is used to form a number of cross-marks having a V-shaped cross-section in correspondence to a grid point 28 defined as an intersection of a dicing line 52X and a dicing line 52Y, wherein each of the cross-marks 28 exposes the semiconductor wafer 51 at a bottom part thereof along a groove 29.

By dicing the semiconductor wafer 51 by applying the saw blade 27 along the dicing lines 52X and 52Y, the semiconductor wafer 51 is divided into a number of semiconductor chips 21 and the semiconductor devices 20C are obtained in a large number. Each of the semiconductor devices 20C thus obtained carries the chamfer surfaces 24B on the four corners of the composite structure 20 forming the semiconductor device 20C as explained previously. As noted already, the semiconductor device 20C thus obtained is substantially immune to shocks or concentration of stress applied to the edges of the composite structure 20 forming the semiconductor device 20C, particularly the four corners thereof.

As the dicing process is conducted such that the V-shaped groove 29 is formed locally, only in the vicinity of the grid points 28, the wear of the V-shaped saw blade 26 used for forming the cross-marks is minimized and the lifetime of the saw blade 26 is maximized. Further, the process time for fabricating the semiconductor device 20C is minimized. As the wafer 51 of FIG. 12A reduces the total length of dicing made by the saw blade 27A for cutting the resin layer 22 as a result of the formation of the separated cross-marks, the problem of damaging of the semiconductor chip 21 or the resin layer 22 thereon, which tends to occur when the saw blade 27A cuts a stacked structure of a semiconductor substrate and a resin layer, is successfully minimized.

[Eighth Embodiment]

Next, another fabrication process of the semiconductor device 20C according to an eighth embodiment of the present invention will be described with reference to FIG. 13 and further with reference to FIGS. 14A and 14B.

Figure 13:
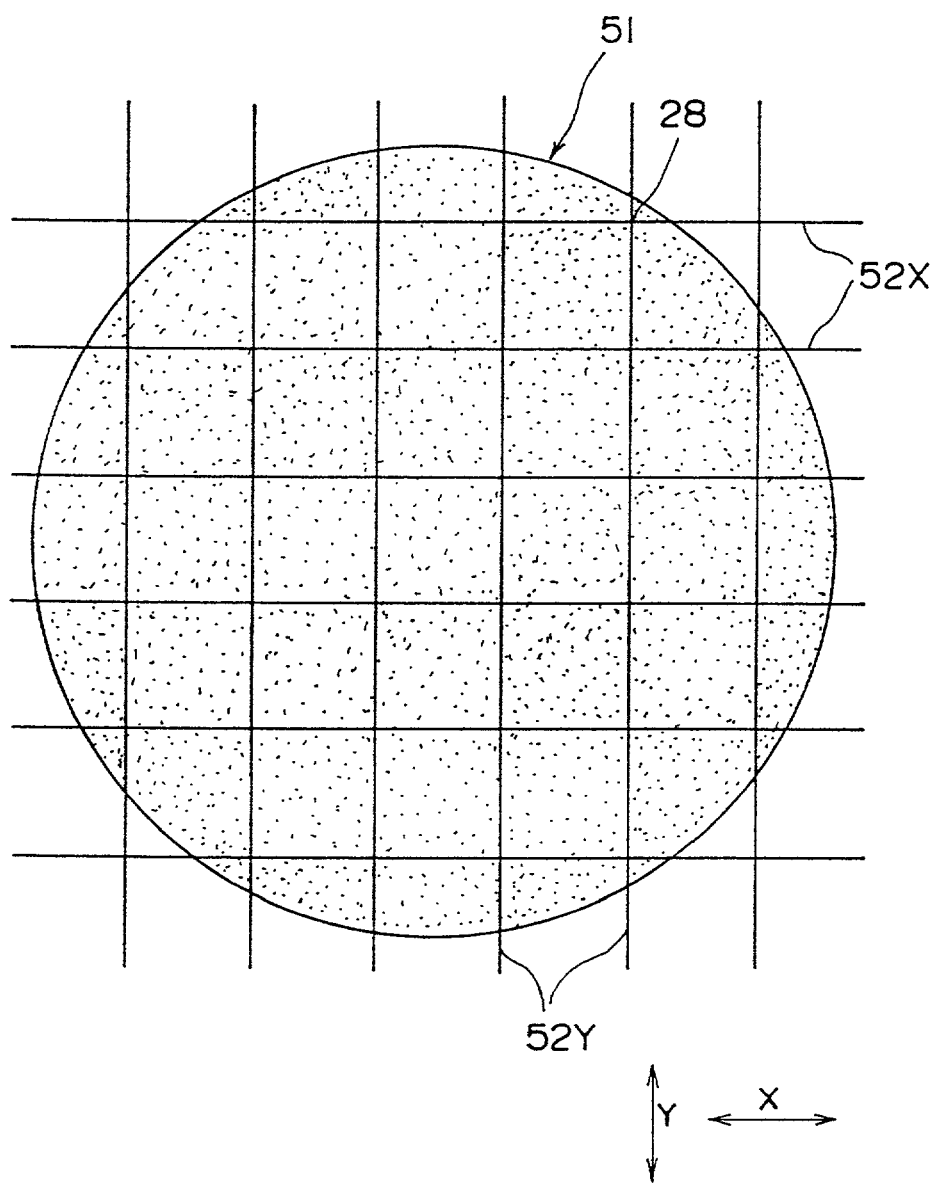
FIG. 13 is a diagram showing the fabrication process of a semiconductor device according to an eighth embodiment of the present invention.
Figure 14A:
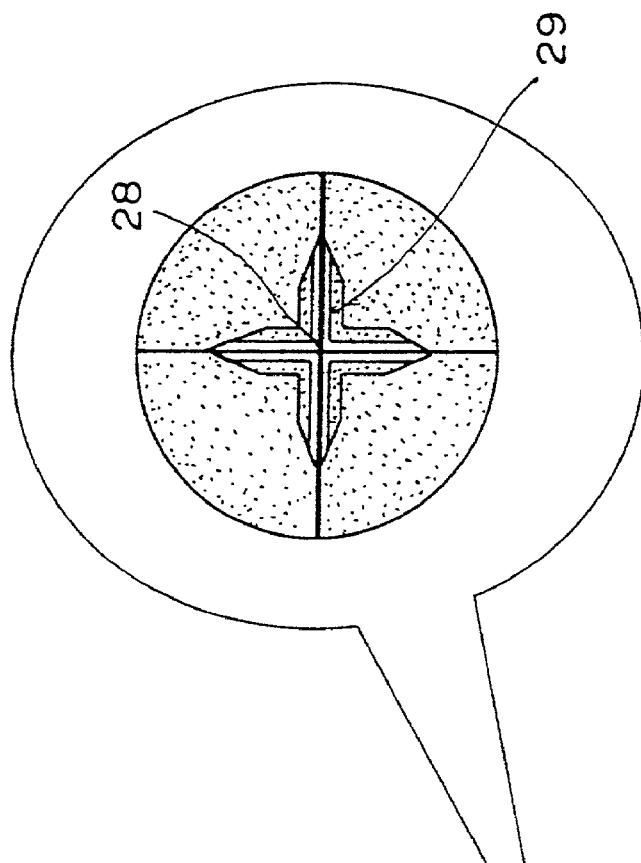
FIGS. 14A and 14B are further diagrams showing the fabrication process of the eight embodiment.
Figure 14B:
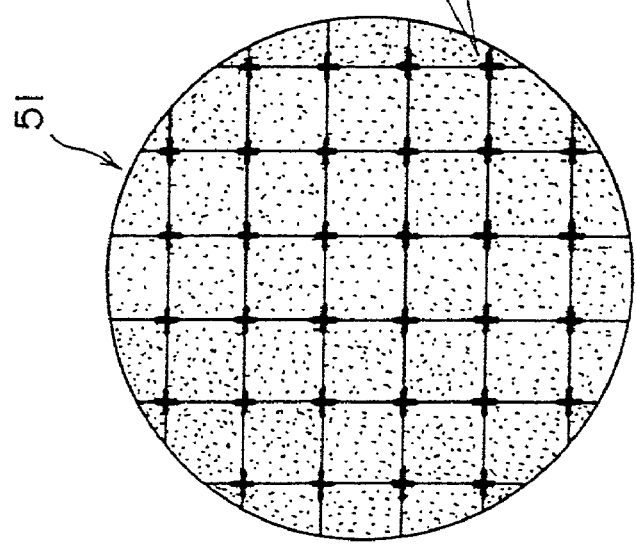

Referring to FIG. 13, the semiconductor wafer 51 is diced by the saw blade 27A of FIG. 11A together with the resin layer 22 thereon along the dicing lines 52X and 52Y into individual semiconductor chips.

After the dicing step of FIG. 13, the V-shaped saw blade 26 is applied to the resin layer 22 in correspondence to each cross point 28 where a dicing line 52X and a dicing line 52Y intersect with each other, such that the saw blade 26 cuts into the semiconductor chips 21 underneath the resin layer 22 in the form of V-shaped grooves 29. As a result, cross-marks similar to the cross-mark of FIG. 12B are formed on each of the four corners of the semiconductor chips 21 as indicated in FIGS. 14A and 14B. The cross-mark thus formed corresponds to the chamfer surfaces 24B formed at the four corners of the semiconductor device 20C of FIGS. 8A and 8B, and the chamfer surfaces 24B effectively dissipate the shock or stress applied to the corners of the semiconductor device 20C.

As explained already with reference to the embodiment of the semiconductor device 20C, the fabrication process of the present embodiment is advantageous in the point that the total amount of cut or grinding made by the saw blade 26 is reduced as the semiconductor wafer 51 is already diced by the saw blade 27B in the step of FIG. 13. Thereby, the lifetime of the V-shaped saw blade 26 is increased successfully.

In any of the foregoing embodiments, it should be noted that there must hold a relationship $$z_2 < 2(z_1 \times \tan(\theta/2)) \tag{1}$$

in order that the chamfer surface 24A or 24B is to be formed. Thus, the cut-in depth $z_1$ of the V-shaped saw blade 26 is controlled, in view of the edge angle θ or width $z_2$ of the saw blade 27A, so as to satisfy the relationship of Eq.(1) during the grinding process of FIG. 10B or 11E or FIG. 12A or 14A, in order to form the desired chamfer surface 24A or 24B in any of the semiconductor devices 20A and 20C.

[Ninth Embodiment]

Next, the fabrication process according to a ninth embodiment of the present invention for forming the semiconductor device 20B of FIGS. 7A and 7B will be described with reference to FIGS. 15A–15F, wherein those parts corresponding to the parts described previously with reference to any preceding embodiments will be designated by the same reference numerals and the description thereof will be omitted.

Referring to FIG. 15A, a saw blade 27B having a flat edge surface is used in the present embodiment for grooving the resin layer 22 on the semiconductor wafer 51 with a first width in correspondence to a width $z_4$ of the saw blade 27B as indicated in FIG. 15B. As a result of the grooving process of FIG. 15B by the saw blade 27B, a groove 53 having a width $z_4$ is formed in the resin layer 22 with a depth $z_5$ as indicated in FIG. 15C.

Next, in the step of FIG. 15D, the saw blade 27A used in the previous embodiment is applied to the resin layer 22 in alignment with the groove 53, wherein the width $z_2$ of the saw blade 27A is substantially smaller than the width $z_4$ of the saw blade 27B ($z_2 < z_4$). The saw blade 27A cuts into the semiconductor substrate 51 in the step of FIG. 15E and the semiconductor wafer 51 is diced into the individual semiconductor chips 21 as indicated in FIG. 15F. As a result of the dicing of the semiconductor wafer 51, the stepped part 25A is formed along the top edge of each semiconductor device 20B as indicated in FIGS. 7A and 7B.

According to the process of FIGS. 15A–15F, the semiconductor devices 20B explained previously are mass produced easily with a high yield of production, by switching the use of the saw blade 27A and the saw blade 27B having respective widths $z_2$ and $z_4$. Further, it should be noted that, while the saw blade 27A is used to cut the semiconductor wafer 51 including the resin layer 22 thereon, the depth of cutting the resin layer 22 by the saw blade 27A is reduced substantially as the saw blade 27A is applied along the groove 53 already formed by the saw blade 27B. Thereby, the disadvantageous effect, caused by the resin layer 22, on the cutting action of the saw blade 27A is successfully minimized and the dicing process of FIG. 15E is conducted efficiently and with high reliability.

[Tenth Embodiment]

FIGS. 16A and 16B show the fabrication process of the semiconductor device 20D according to a tenth embodiment of the present invention, wherein those parts corresponding to the parts described previously are designated by the same reference numerals and the description thereof will be omitted.

Referring to FIG. 16A showing the semiconductor wafer 51 carrying thereon the resin layer 22, the saw blade 27B of FIG. 15A having the width $z_4$ is applied to the resist layer 22 in the grid points 28 to form the cross-shaped grooves 30 as indicated in FIGS. 16A and 16B. Similarly as before, each grid points 28 is formed at an intersection of the dicing line 52X and the dicing line 52Y.

As the semiconductor device 20D has the stepped part in the resin layer 22 in correspondence to the four corners of the composite structure 20 forming the semiconductor device 20D, the semiconductor device 20D is substantially immune to external shock or stress applied to the vulnerable corners. It should be noted that the process of FIG. 16A and 16B is advantageous in mass producing the semiconductor devices 20D, as a large number of the semiconductor devices 20D are obtained as a result of the dicing process of the semiconductor wafer 51 conducted by the saw blade 27A along the dicing lines 52X and 52Y. Thereby, it should be noted that the wear of the saw blade 27B for forming the cross-shaped grooves 30 is minimized as the saw blade 27B is applied only locally for a limited length in the vicinity of the cross points 28. Further, the wear of the saw blade 27A is minimized as the thickness of the resin layer 22 is reduced in correspondence to the foregoing cross-shaped grooves 30. In addition, the time needed for dicing the semiconductor wafer 51 by the saw blade 27A is reduced as the thickness of the resin layer 22 to be diced is reduced in correspondence to the cross-shaped grooves 30.

[Eleventh Embodiment]

Figure 17A:
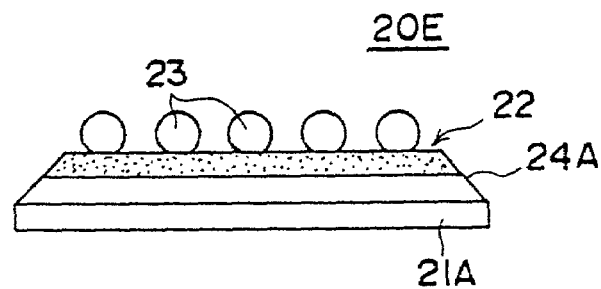
FIGS. 17A–17E are diagrams showing the construction of a semiconductor device according to an eleventh embodiment of the present invention and the fabrication process thereof according to a twelfth embodiment of the present invention.

FIG. 17A shows the construction of a semiconductor device 20E according to an eleventh embodiment of the present invention in a side view, wherein those parts corresponding to the parts described previously are designated by the same reference numerals and the description thereof will be omitted.

Referring to FIG. 17A, the semiconductor device 20E has a construction similar to the semiconductor device 20A except that the semiconductor device is formed on a semiconductor chip 21A having a reduced thickness. As a result, the semiconductor device 20E has a reduced total thickness.

[Twelfth Embodiment]

FIGS. 17B–17E show the fabrication process of the semiconductor device 20E according to a twelfth embodiment of the present invention.

Figure 17B:
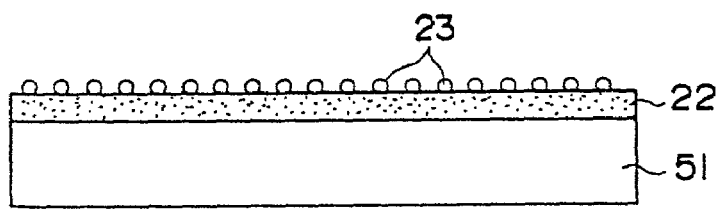

Referring to FIG. 17B, the monolithic electronic circuits are formed on the substrate 51 in correspondence to the semiconductor integrated circuits to be formed on the substrate 51, and the bump electrodes 23 are formed on the substrate 51 in contact with the electrode pads on the substrate 51 provided in correspondence to each of the semiconductor integrated circuits. Further, the surface of the semiconductor wafer 51 carrying the bump electrodes 23 is sealed by the resist layer 22 in the state that the bump electrodes 23 project beyond the resist layer 22.

Figure 17C:
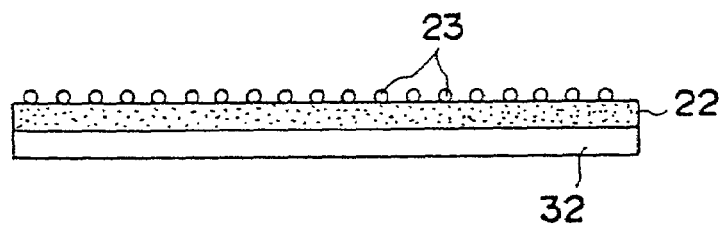

Next, in the step of FIG. 17C, the rear surface of the semiconductor wafer 51 is subjected to a grinding process until the thickness of the wafer 51 is reduced to a desired thickness.

Figure 17D:
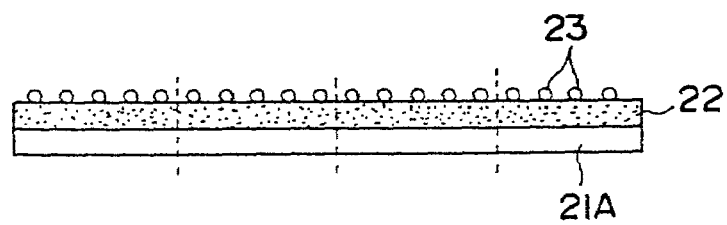
Figure 17E:
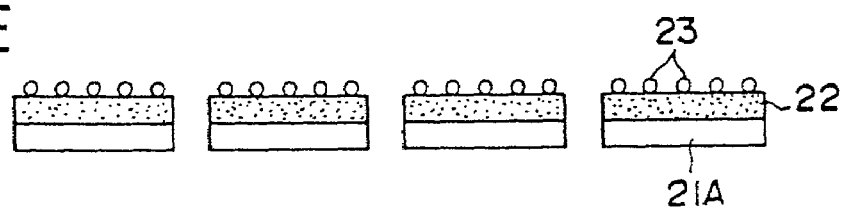

Next, the dicing process of FIGS. 10A–10F is applied to the wafer 51 in the step of FIG. 17D and the semiconductor devices 20E are formed as indicated in FIG. 17E. While not illustrated, each of the semiconductor devices 20E is defined by the chamfer surface 24A as represented in FIG. 17A.

In the foregoing fabrication process of the semiconductor device 20E, it should be noted that the dicing process of FIG. 17D is carried out safely without damaging the thin semiconductor wafer 51 even in such a case in which a large-diameter wafer is used for the semiconductor wafer 51, by protecting the wafer 51 by the resin layer 22.

[Thirteenth Embodiment]

FIGS. 18A–18D show the fabrication process of the semiconductor wafer 51 used in the previous embodiments, according to a thirteenth embodiment of the present invention.

Figure 18A:
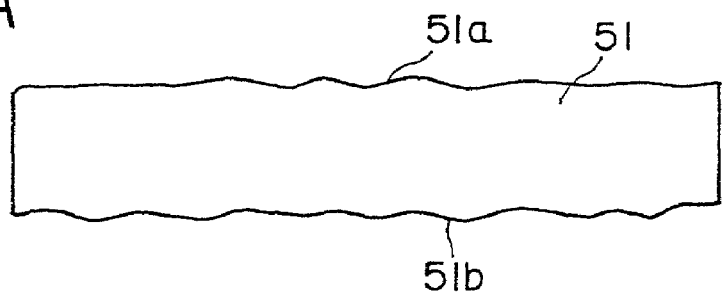
FIGS. 18A–18D are diagrams showing the fabrication process of a semiconductor device according to a thirteenth embodiment of the present invention.

Referring to FIG. 18A showing the semiconductor wafer 51 as sliced from a semiconductor crystal ingot, it can be seen that the wafer 51 is defined by rough principal surfaces 51a and 51b.

Figure 18B:
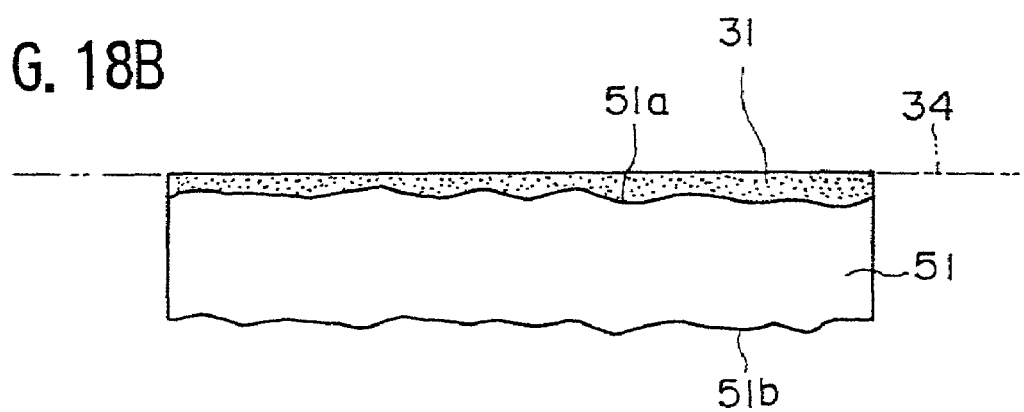

Thus, the present embodiment applies a resin layer 31 on the rough principal surface 51a of the wafer 51 in the step of FIG. 18B such that the resin layer 31 has a flat, planarized surface 34.

Figure 18C:
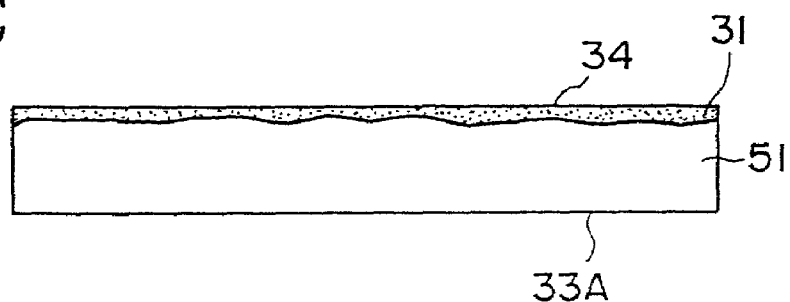

Next, in the step of FIG. 18C, the rear principal surface 51b is subjected to a grinding process to form a processed surface 33A while using the surface 34 of the resin layer 31 as a reference surface. As the reference surface 34 is a planarized surface, the processed surface 33A thus obtained is also a planarized surface.

Figure 18D:
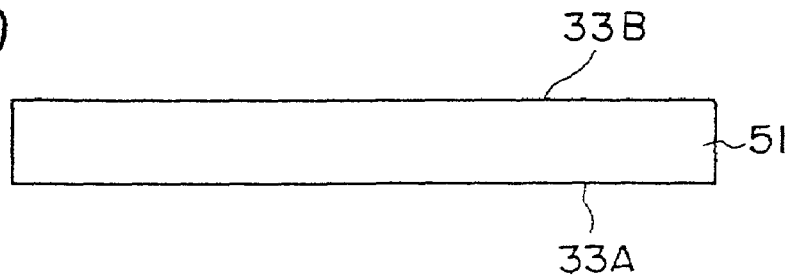

Further, in the step of FIG. 18D, the resin layer 31 is processed by a grinding process while using the planarized surface 33A corresponding to the principal surface 51b as a reference surface, until the resin layer 31 is removed completely. As a result of the process of FIG. 18D, a flat, planarized surface 33B is obtained in correspondence to the foregoing rough principal surface 51a such that the surface 33B opposes the surface 33A.

The semiconductor wafer 51 thus obtained by the planarizing process of the present embodiment is suitable for the substrate of semiconductor devices.

[Fourteenth Embodiment]

Figure 19A:
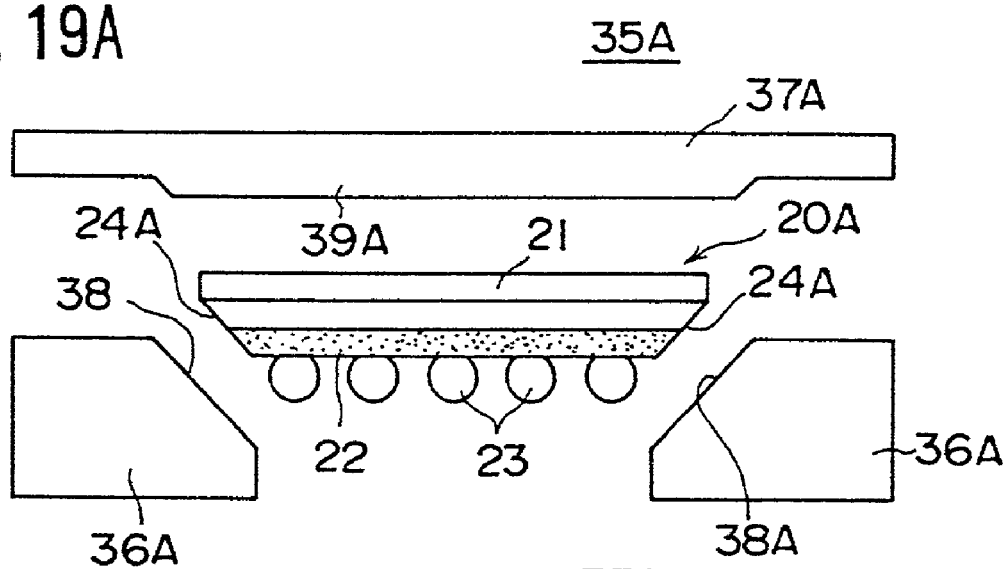
FIGS. 19A–19C are diagrams showing the construction of a transportation tray according to a fourteenth embodiment of the present invention.
Figure 19B:
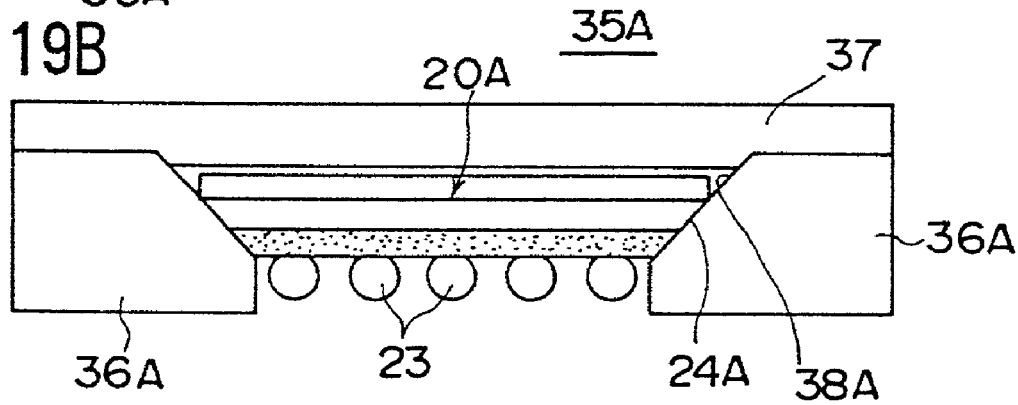
Figure 19C:
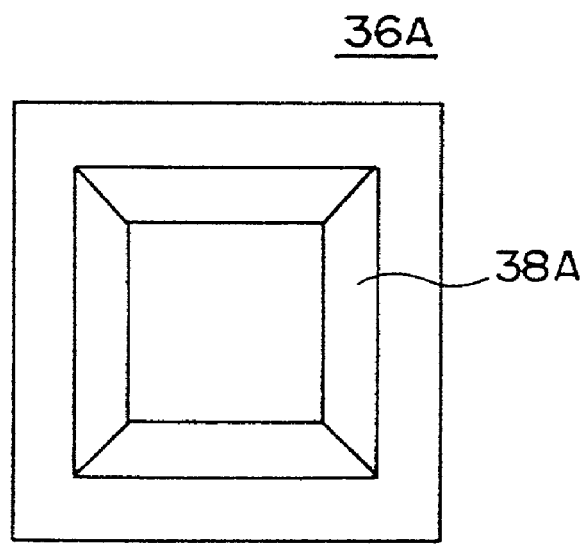

FIGS. 19A–19C show the construction of a transportation tray 35A according to a fourteenth embodiment of the present invention, wherein those parts corresponding to the parts described previously are designated by the same reference numerals and the description thereof will be omitted.

Referring to FIGS. 19A–19C, the transportation tray 35A is adapted to carry the semiconductor device 20A of the first embodiment and generally includes a tray main-body 36A and a cap 37A provided thereon, wherein the tray main-body 36A includes a chamfered surface 38A corresponding to the chamfered surface 24A of the semiconductor device 20A as indicated in FIG. 19A or 19C, and the semiconductor device 20A settles on the tray main-body 36A as indicated in FIG. 19B by engaging the chamfered surface 24A with the chamfered surface 38A of the tray main-body 36A.

According to the present embodiment, the semiconductor device 20A is self-positioned inside the transportation tray 35A as a result of the foregoing engagement of the chamfered surface 24A and the chamfered surface 38A. Thereby, rattling of the semiconductor device 20A inside the tray 35A including rattling in the lateral direction is also eliminated and the problem of damaging of the bump electrodes 23 caused by collision with the tray main-body 36A is eliminated successfully.

In the present embodiment, in which the foregoing positioning of the semiconductor device 20A is achieved as a result of the engagement of the chamfered surface 24A and the chamfered surface 38A, it is not necessary to form the tray main-body 36A such that the tray main-body 36A has an exactly determined overhang structure for supporting the semiconductor device 20A.

[Fifteenth Embodiment]

Figure 20A:
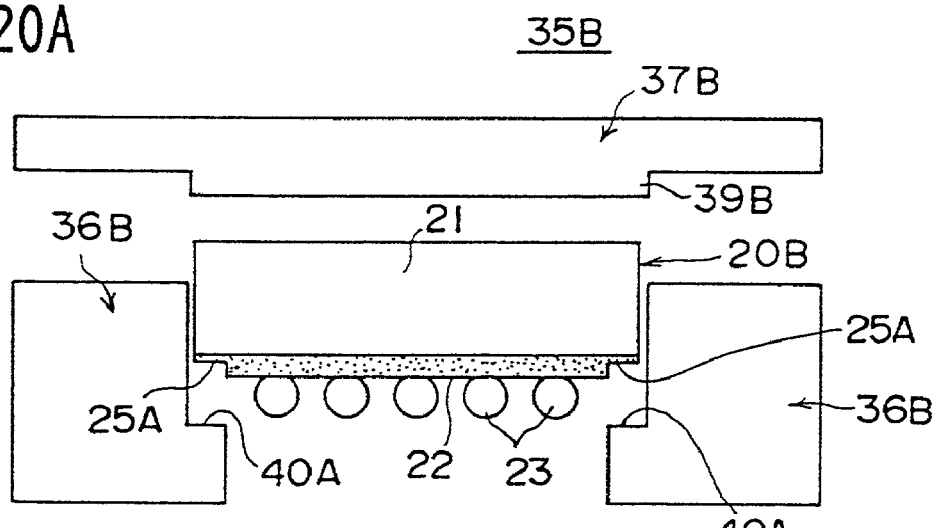
FIGS. 20A–20C are diagrams showing the construction of a transportation tray according to a fifteenth embodiment of the present invention.
Figure 20B:
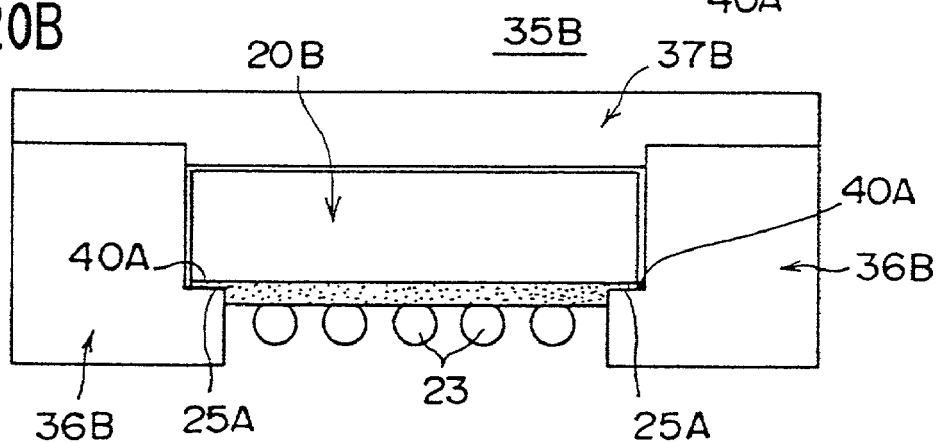
Figure 20C:
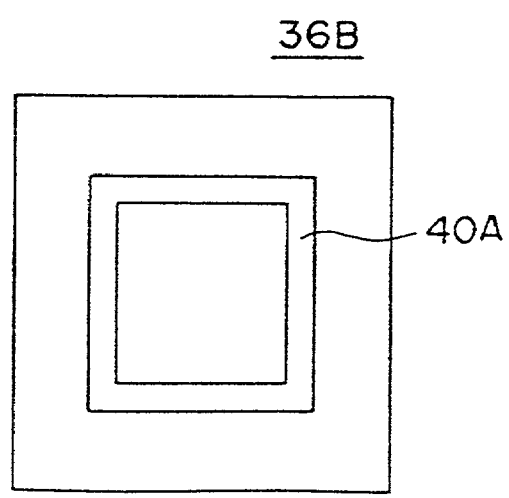

FIGS. 20A–20C show the construction of a transportation tray 35B according to a fifteenth embodiment of the present invention, wherein those parts corresponding to the parts described previously are designated by the same reference numerals and the description thereof will be omitted.

Referring to FIGS. 20A–20C, the transportation tray 35B is adapted to carry the semiconductor device 20B of the second embodiment and generally includes a tray main-body 36B and a cap 37B provided thereon, wherein the tray main-body 36B includes a stepped part 40A corresponding to the stepped part 25A of the semiconductor device 20B as indicated in FIG. 20A or 20C, and the semiconductor device 20B settles on the tray main-body 36B as indicated in FIG. 20B by engaging the stepped part 25A with the stepped part 40A of the tray main-body 36B.

According to the present embodiment, the semiconductor device 20B is self-positioned inside the transportation tray 35B as a result of the foregoing engagement of the stepped part 25A and the stepped part 40A. Thereby, the rattling of the semiconductor device 20B inside the tray 35B including rattling in the lateral direction is also eliminated and the problem of damaging of the bump electrodes 23 caused by collision with the tray main-body 36B is eliminated successfully.

[Sixteenth Embodiment]

Figure 21A:
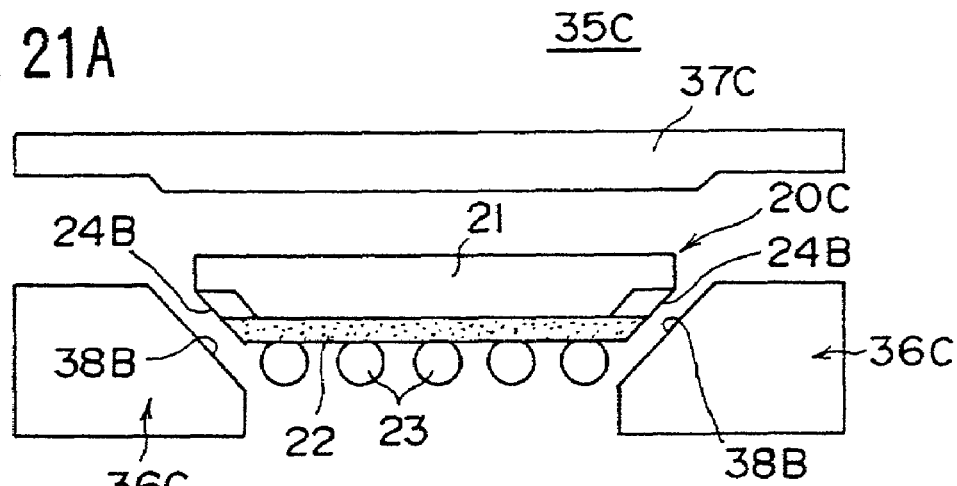
FIGS. 21A–21C are diagrams showing the construction of a transportation tray according to a sixteenth embodiment of the present invention.
Figure 21B:
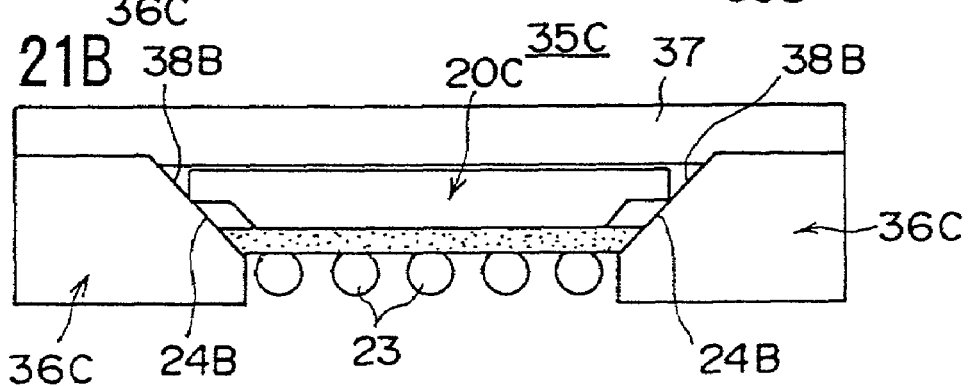
Figure 21C:
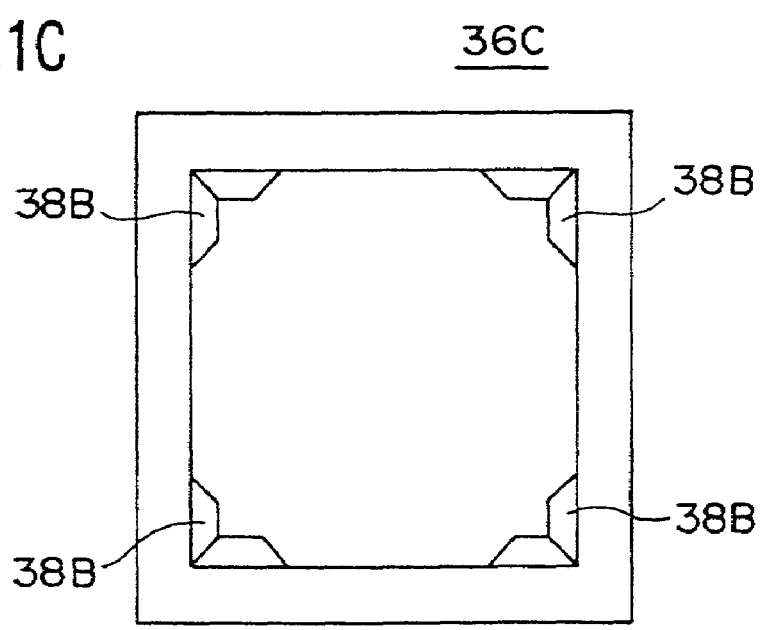

FIGS. 21A–21C show the construction of a transportation tray 35C according to a sixteenth embodiment of the present invention, wherein those parts corresponding to the parts described previously are designated by the same reference numerals and the description thereof will be omitted.

Referring to FIGS. 21A–21C, the transportation tray 35C is adapted to carry the semiconductor device 20C of the third embodiment and generally includes a tray main-body 36C and a cap 37C provided thereon, wherein the tray main-body 36C includes chamfer surfaces 38B corresponding to the chamfer surfaces 24B at the four corners of the semiconductor device 20B as indicated in FIG. 21A or 16C, and the semiconductor device 20C settles on the tray main-body 36C as indicated in FIG. 21B by engaging the chamfer surfaces 24B with the corresponding chamfer surfaces 38B of the tray main-body 36C.

According to the present embodiment, the semiconductor device 20C is self-positioned inside the transportation tray 35C as a result of the foregoing engagement of the chamfered surfaces 24B and the corresponding chamfered surfaces 38B. Thereby, rattling of the semiconductor device 20C inside the tray 35C including rattling in the lateral direction is eliminated and the problem of damaging of the bump electrodes 23 caused by collision with the tray main-body 36C is eliminated successfully.

In the present embodiment, in which the foregoing positioning of the semiconductor device 20C is achieved as a result of the engagement of the chamfered surface 24B and the chamfered surface 38B, it is not necessary to form the tray main-body 36C such that the tray main-body 36C has an exactly determined overhang structure for supporting the semiconductor device 20C.

[Seventeenth Embodiment]

Figure 22A:
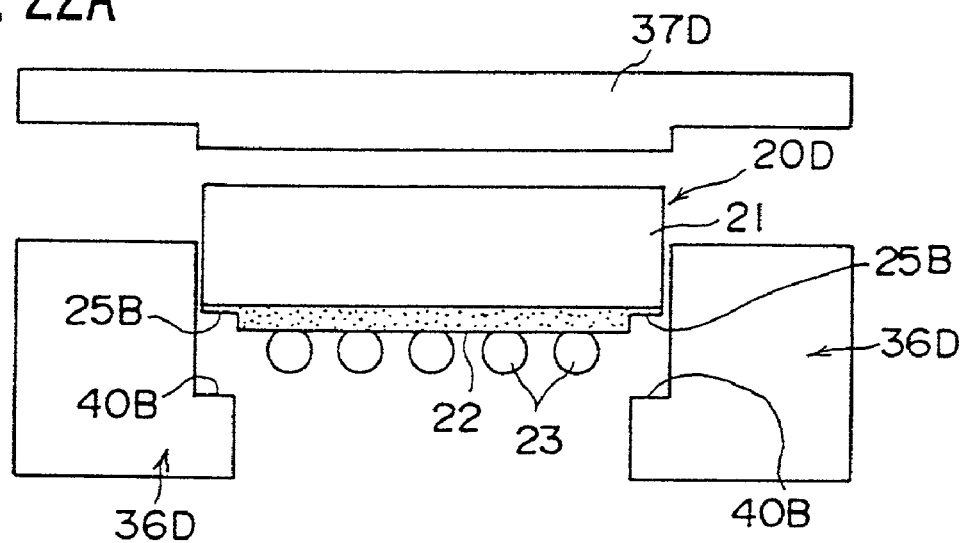
FIGS. 22A–22C are diagrams showing the construction of a transportation tray according to a seventeenth embodiment of the present invention.
Figure 22B:
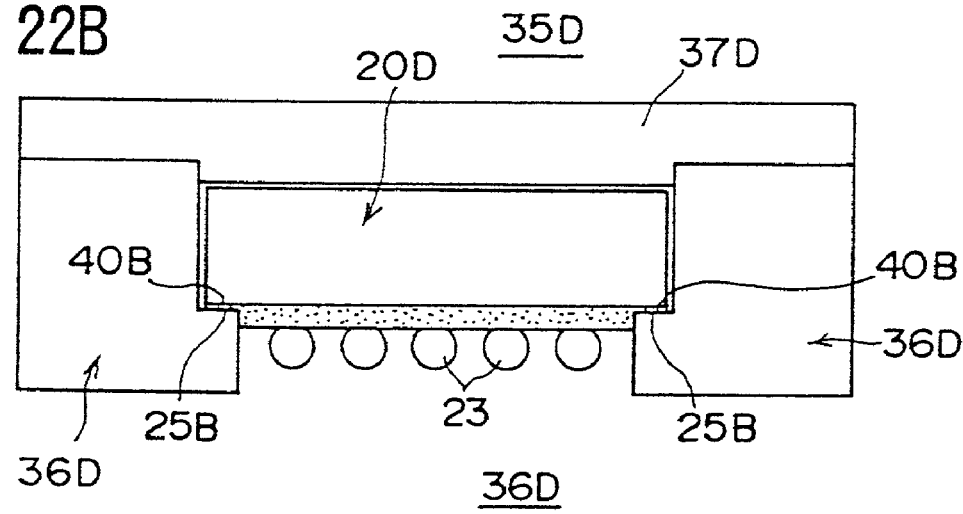
Figure 22C:
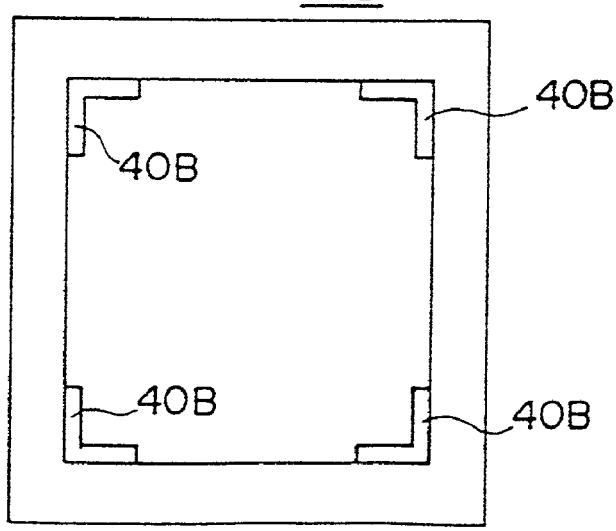

FIGS. 22A–22C show the construction of a transportation tray 35D according to a seventeenth embodiment of the present invention, wherein those parts corresponding to the parts described previously are designated by the same reference numerals and the description thereof will be omitted.

Referring to FIGS. 22A–22C, the transportation tray 35D is adapted to carry the semiconductor device 20D of the fourth embodiment and generally includes a tray main-body 36D and a cap 37D provided thereon, wherein the tray main-body 36D includes stepped parts 40B corresponding to the stepped parts 25B on the four corners of the semiconductor device 20D as indicated in FIG. 22A or 22C, and the semiconductor device 20D settles on the tray main-body 36D as indicated in FIG. 22B by engaging the stepped parts 25B with the corresponding stepped parts 40B of the tray main-body 36D.

According to the present embodiment, the semiconductor device 20D is self-positioned inside the transportation tray 35D as a result of the foregoing engagement of the stepped parts 25B and the corresponding stepped parts 40B. Thereby, the rattling of the semiconductor device 20D inside the tray 35D including rattling in the lateral direction is also eliminated and the problem of damaging of the bump electrodes 23 caused by collision with the tray main-body 36D is eliminated successfully.

[Eighteenth Embodiment]

Figure 23A:
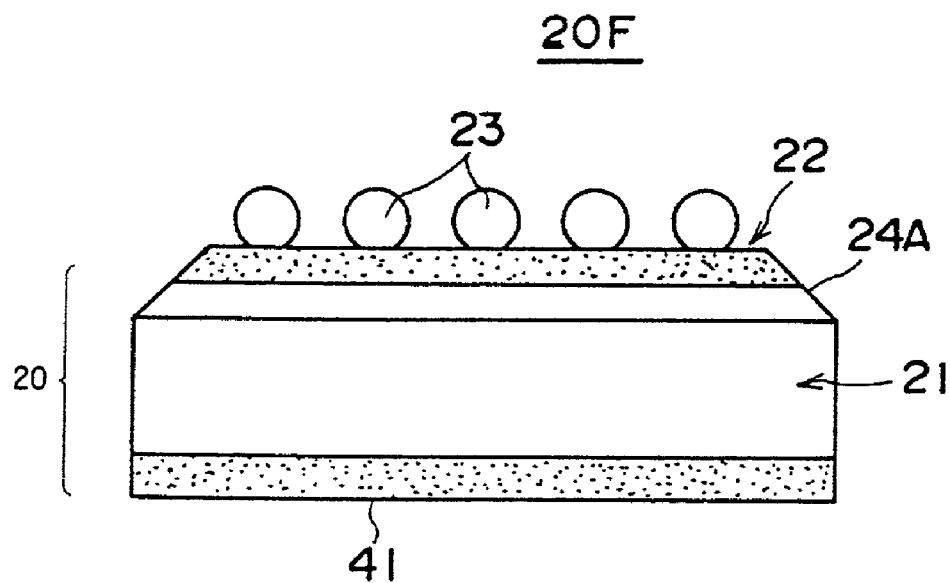
FIGS. 23A and 23B are diagrams showing the construction of a semiconductor device according to an eighteenth embodiment of the present invention.
Figure 23B:
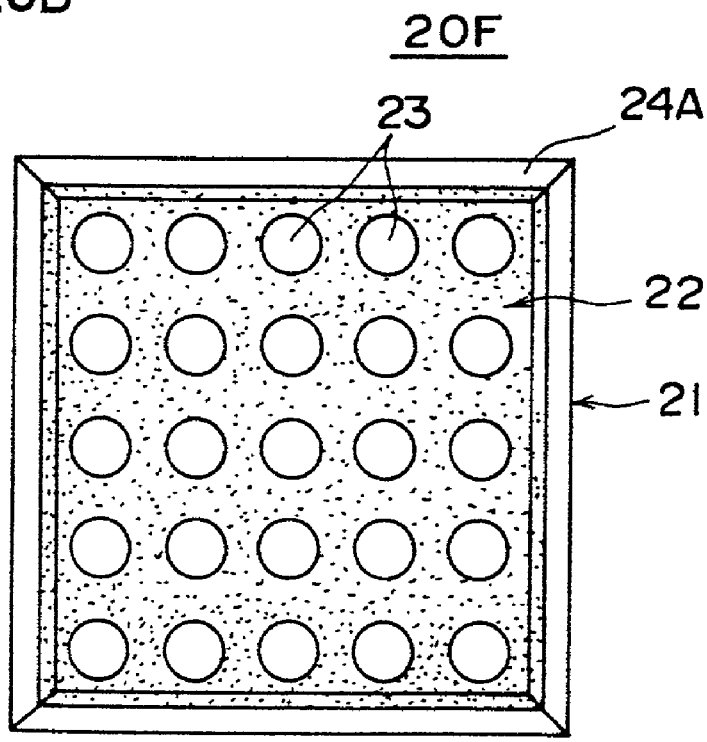

FIGS. 23A and 23B are diagrams showing the construction of a semiconductor device 20F according to an eighteenth embodiment of the present invention, wherein those parts corresponding to the parts described previously are designated by the same reference numerals and the description thereof will be omitted.

Referring to FIGS. 23A and 23B, the semiconductor device 20F has a construction similar to that of the semiconductor device 20A except that a resin layer 41 is provided also on the rear or bottom surface of the semiconductor chip 21. The resin layer 41 is made of a material identical with to the material forming the resin layer 22 such as polyimide or epoxy and is formed by a compressive molding process so as to cover the entire bottom surface of the semiconductor chip 21.

By forming the semiconductor device 20F as such, the protection of the semiconductor chip 21 is improved and the problem damages in the bottom surface of the semiconductor chip 21 at the time of dicing the semiconductor wafer 51 into individual semiconductor chips 21 is successfully eliminated.

[Nineteenth Embodiment]

Figure 24A:
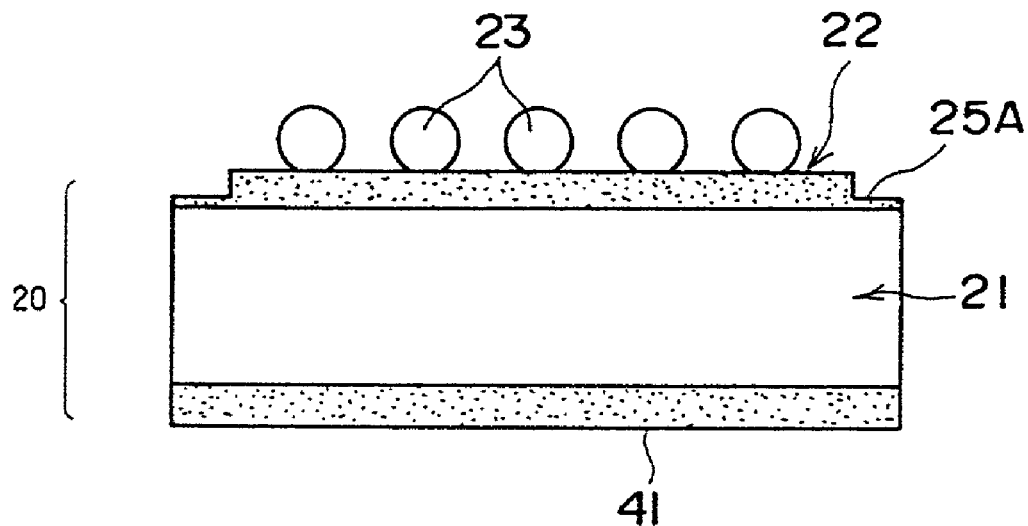
FIGS. 24A and 24B are diagrams showing the construction of a semiconductor device according to a nineteenth embodiment of the present invention.
Figure 24B:
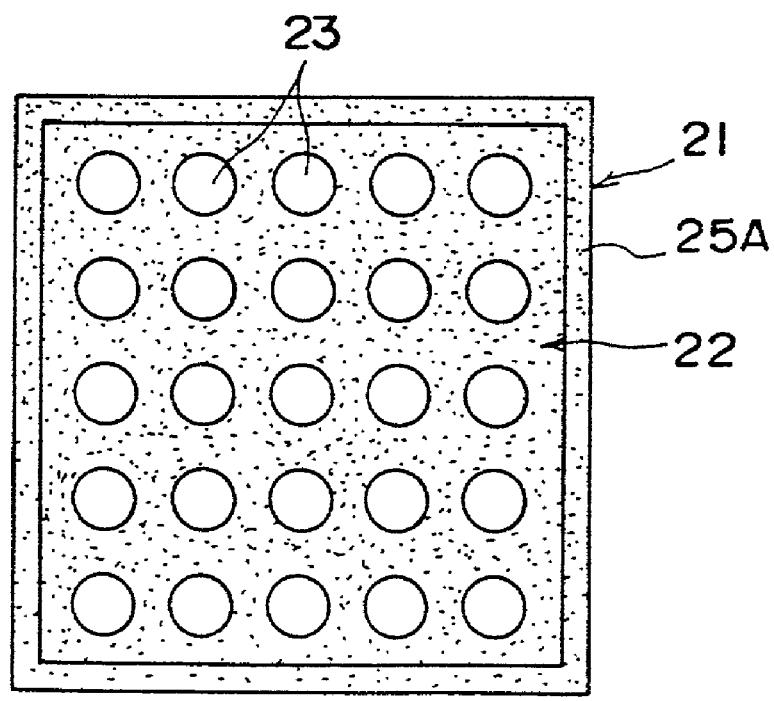

FIGS. 24A and 24B are diagrams showing the construction of a semiconductor device 20G according to a nineteenth embodiment of the present invention, wherein those parts corresponding to the parts described previously are designated by the same reference numerals and the description thereof will be omitted.

Referring to FIGS. 24A and 24B, the semiconductor device 20G has a construction similar to that of the semiconductor device 20B except that the resin layer 41 is provided also on the rear surface of the semiconductor chip 21.

By forming the semiconductor device 20G as such, the protection of the semiconductor chip 21 is improved and the problem of formation of damages in the rear surface of the semiconductor chip 21 at the time of dicing the semiconductor wafer 51 into individual semiconductor chips 21 is successfully eliminated.

[Twentieth Embodiment]

Figure 25A:
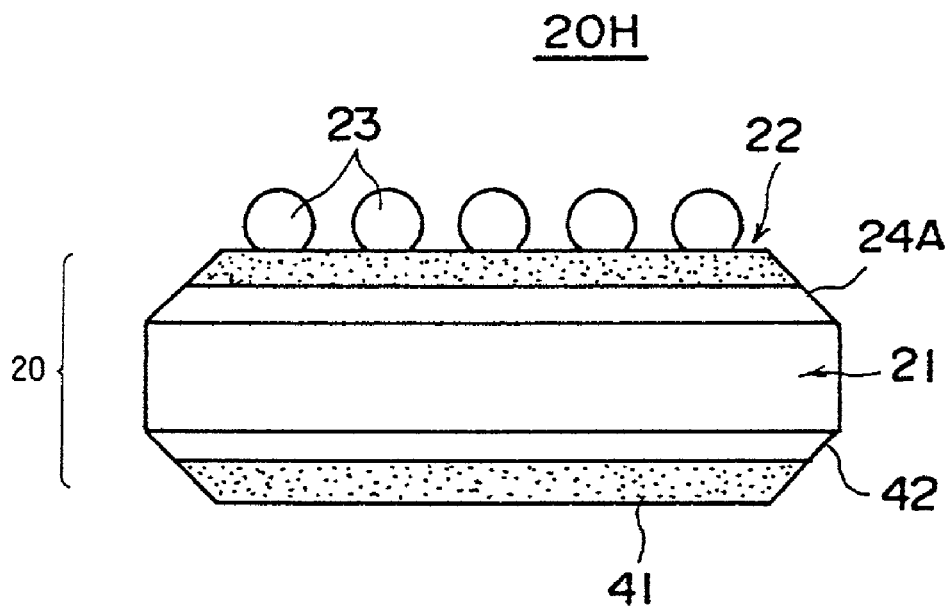
FIGS. 25A and 25B are diagrams showing the construction of a semiconductor device according to a twentieth embodiment of the present invention.
Figure 25B:
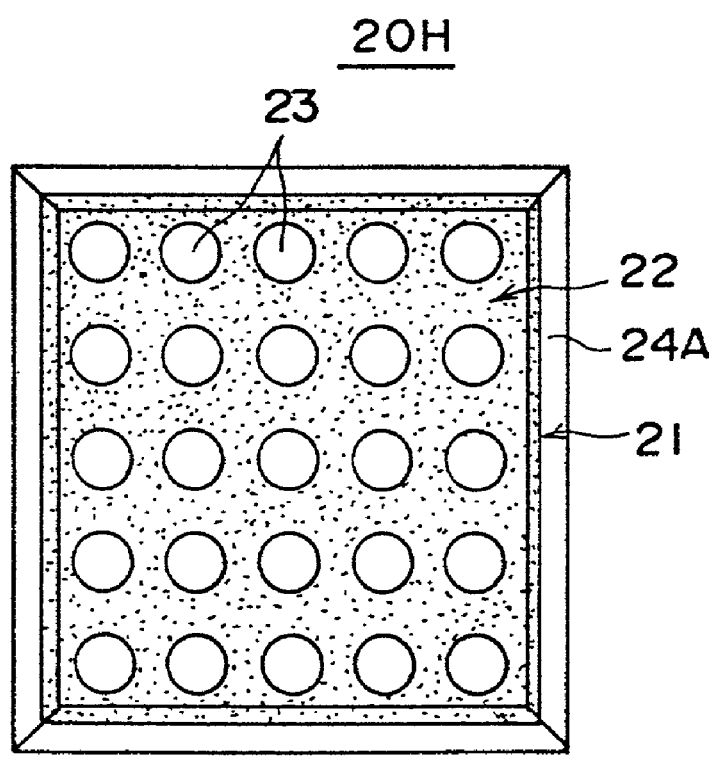

FIGS. 25A and 25B show the construction of a semiconductor device 20H according to a twentieth embodiment of the present invention, wherein those parts corresponding to the parts described previously are designated by the same reference numerals and the description thereof will be omitted.

Referring to FIGS. 25A and 25B, the semiconductor device 20H has a construction similar to that of the semiconductor device 20F except that the semiconductor chip 21 is formed with another chamfer surface 42 such that the chamfer surface 42 surrounds the bottom surface of the semiconductor chip 21 similarly to the chamfer surface 24A, which chamfer surface 24A surrounds the top surface of the semiconductor chip 21. The bottom surface of the semiconductor chip 21 is covered by the resin layer 41 similarly to the semiconductor device 20F, and thus, the chamfer surface 42 cuts the resin layer 41 and the bottom edge of the semiconductor chip 21.

According to the present embodiment, the semiconductor device 20H is protected not only from the external shock or stress applied to the upper corners or top edges of the device 20H but also from external shocks or stresses applied to the bottom corners or bottom edges as a result of the formation of the chamfer surface 42 that dissipates the shock or stress applied thereto. Thereby, handling of the semiconductor device 21H during the fabrication process of an electronic apparatus that uses the semiconductor device 21H is facilitated substantially.

In the present embodiment, the chamfer surface 42 is not limited to a flat surface but may be formed of a curved surface. Further, the chamfer surface 42 may be formed of a plurality of chamfer surfaces.

[Twenty-First Embodiment]

Figure 26A:
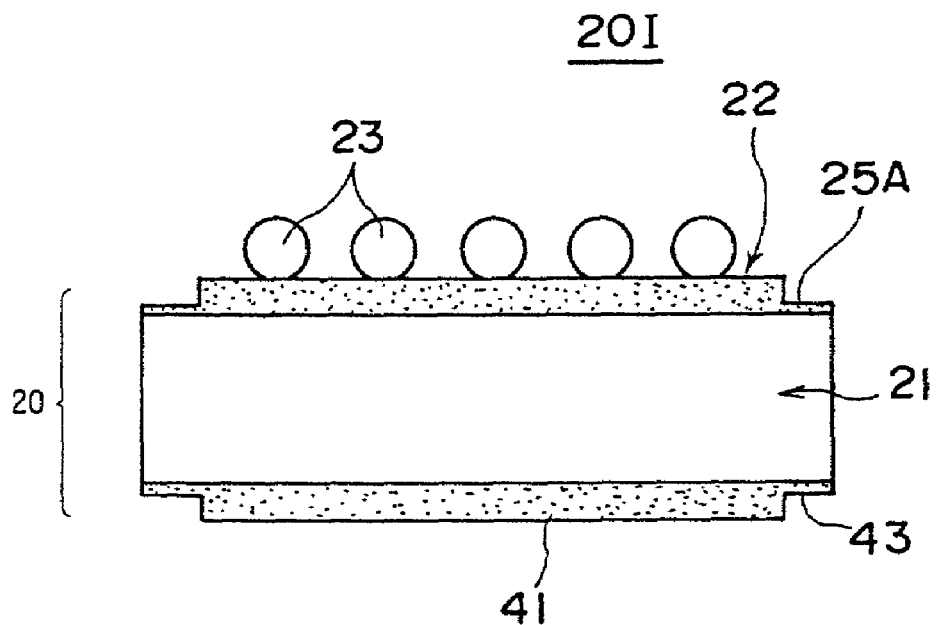
FIGS. 26A and 26B are diagrams showing the construction of a semiconductor device according to a twenty-first embodiment of the present invention.
Figure 26B:
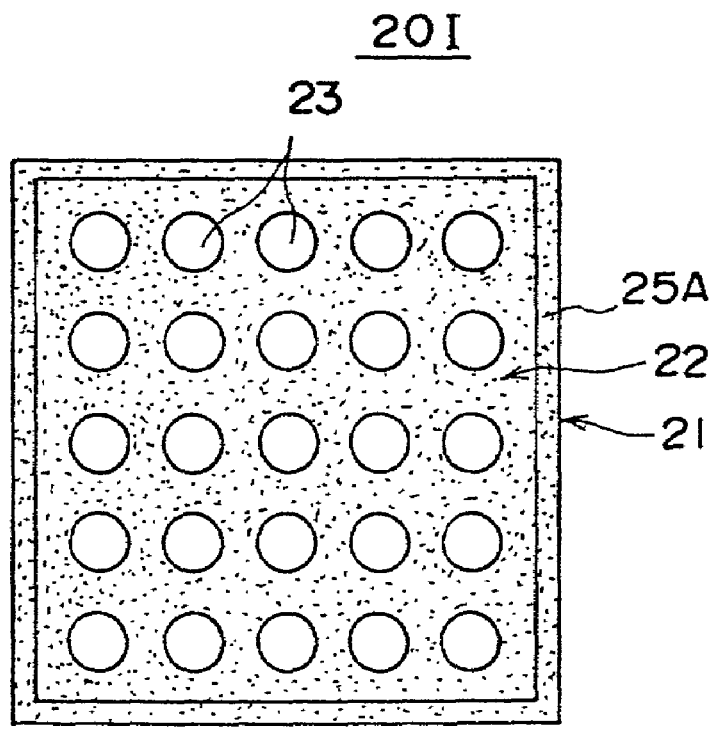

FIGS. 26A and 26B show the construction of a semiconductor device 20I according to a twenty-first embodiment of the present invention, wherein those parts corresponding to the parts described previously are designated by the same reference numerals and the description thereof will be omitted.

Referring to FIGS. 26A and 26B, the semiconductor device 20G has a construction similar to that of the semiconductor device 20G except that the bottom surface of the semiconductor chip 21 is covered by the resin layer 41 and the resin layer 41 of the semiconductor device 20G is formed with another stepped structure 43 similarly to the stepped structure 25A that surrounds the top surface of the semiconductor chip 21.

According to the present embodiment, the semiconductor device 20I is protected not only from the external shock or stress applied to the upper corners or top edges of the device but also from external shock or stress applied to the bottom corners or bottom edges as a result of the formation of the stepped structure 43 that dissipates the shock or stress applied thereto. Thereby, handling of the semiconductor device 21G during the fabrication process of an electronic apparatus that uses the semiconductor device 21G is facilitated substantially.

In the present embodiment, the stepped structure 43 may be formed of a curved surface. Further, the stepped structure 43 may be formed of a plurality of steps.

[Twenty-Second Embodiment]

Figure 27A:
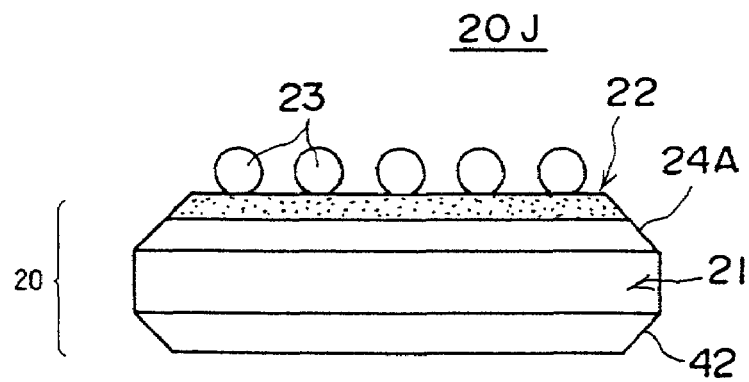
FIGS. 27A–27C are diagrams showing the construction of a semiconductor device according to a twenty-second embodiment of the present invention.
Figure 27B:
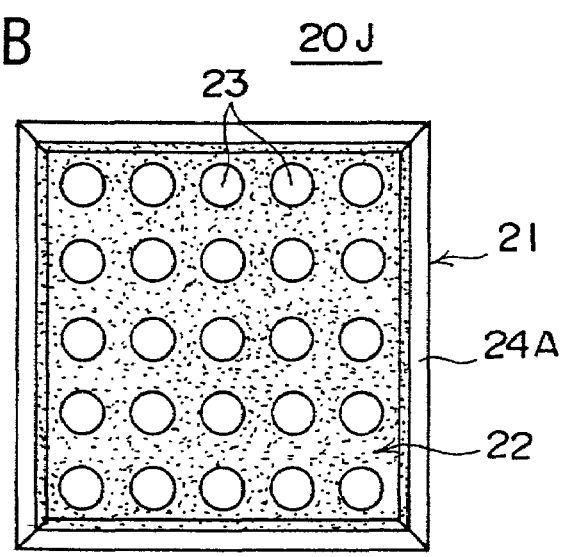
Figure 27C:
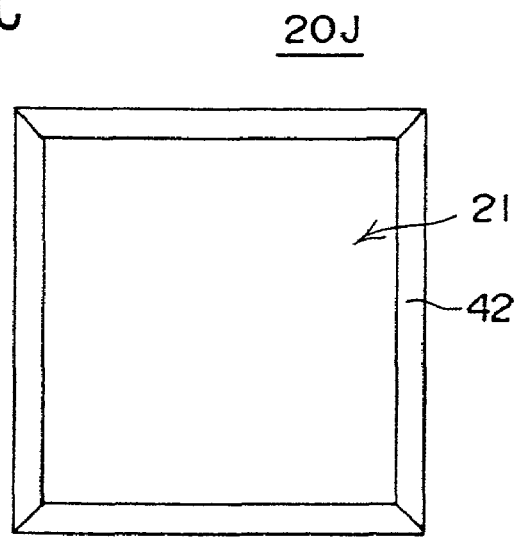

FIGS. 27A–27C show the construction of a semiconductor device 20J according to a twenty-second embodiment of the present invention respectively in a side view, top view and a bottom view, wherein those parts corresponding to the parts described previously are designated by the same reference numerals and the description thereof will be omitted.

Referring to FIGS. 27A–27C, the semiconductor device 20J has a construction similar to that of the semiconductor device 20A except that the semiconductor chip 21 is formed with another chamfer surface 42 such that the chamfer surface 42 surrounds the bottom surface of the semiconductor chip 21 similarly to the chamfer surface 24A, which surrounds the top surface of the semiconductor chip 21.

According to the present embodiment, the semiconductor device 20J is protected not only from the external shock or stress applied to the upper corners or top edges of the device 20J but also from external shocks or stresses applied to the bottom corners or bottom edges as a result of the formation of the chamfer surface 42 that dissipates the shock or stress applied thereto. Thereby, handling of the semiconductor device 21G during the fabrication process of an electronic apparatus that uses the semiconductor device 21G is facilitated substantially.

In the present embodiment, the chamfer surface 42 is not limited to a flat surface but may be formed of a curved surface. Further, the chamfer surface 42 may be formed of a plurality of chamfer surfaces.

[Twenty-Third Embodiment]

Figure 28:
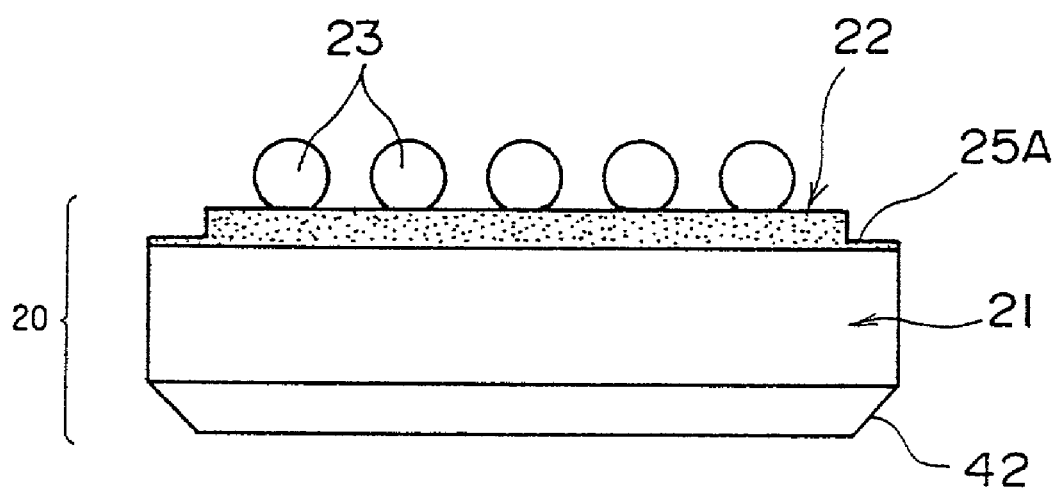
FIG. 28 is a diagram showing the construction of a semiconductor device according to a twenty-third embodiment of the present invention.

FIG. 28 shows the construction of a semiconductor device 20K according to a twenty-third embodiment of the present invention, wherein those parts corresponding to the parts described previously are designated by the same reference numerals and the description thereof will be omitted.

Referring to FIG. 28, the semiconductor device 20K has a construction similar to that of the semiconductor device 20B except that the semiconductor chip 21 of the semiconductor device 20G is formed with the chamfer surface 42 such that the chamfer surface 42 surrounds the bottom surface of the semiconductor chip 21.

According to the present embodiment, the semiconductor device 20K is protected not only from the external shock or stress applied to the upper corners or top edges of the device but also from external shock or stress applied to the bottom corners or bottom edges as a result of the formation of the chamfered surface 42 that dissipates the shock or stress applied thereto. Thereby, handling of the semiconductor device 21G during the fabrication process of an electronic apparatus that uses the semiconductor device 21G is facilitated substantially.

In the present embodiment, the chamfered surface 42 may be formed of a curved surface. Further, the chamfer surface 43 may be formed of a plurality of chamfer surfaces.

[Twenty-Fourth Embodiment]

Figure 29A:
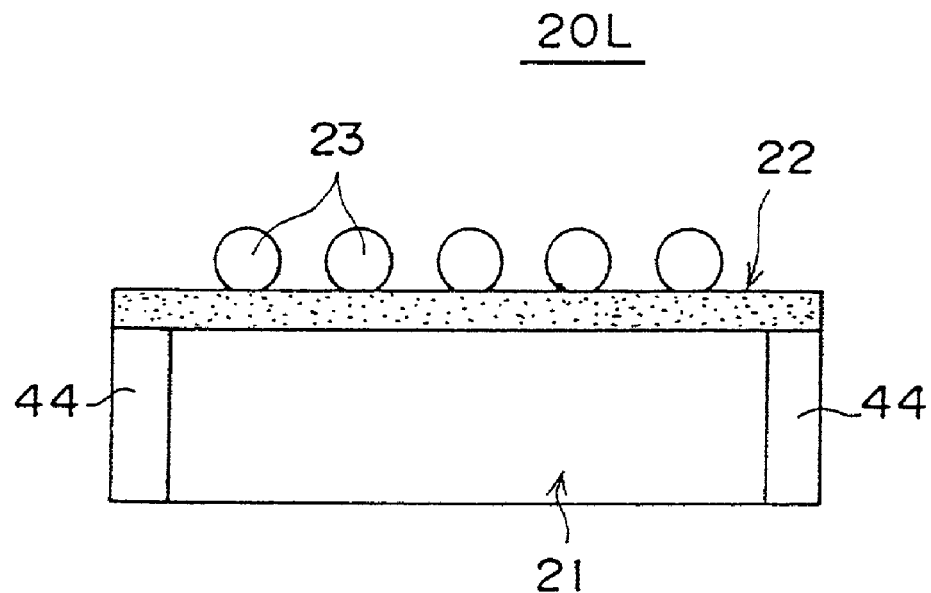
FIGS. 29A and 29B are diagrams showing the construction of a semiconductor device according to a twenty-fourth embodiment of the present invention.
Figure 29B:
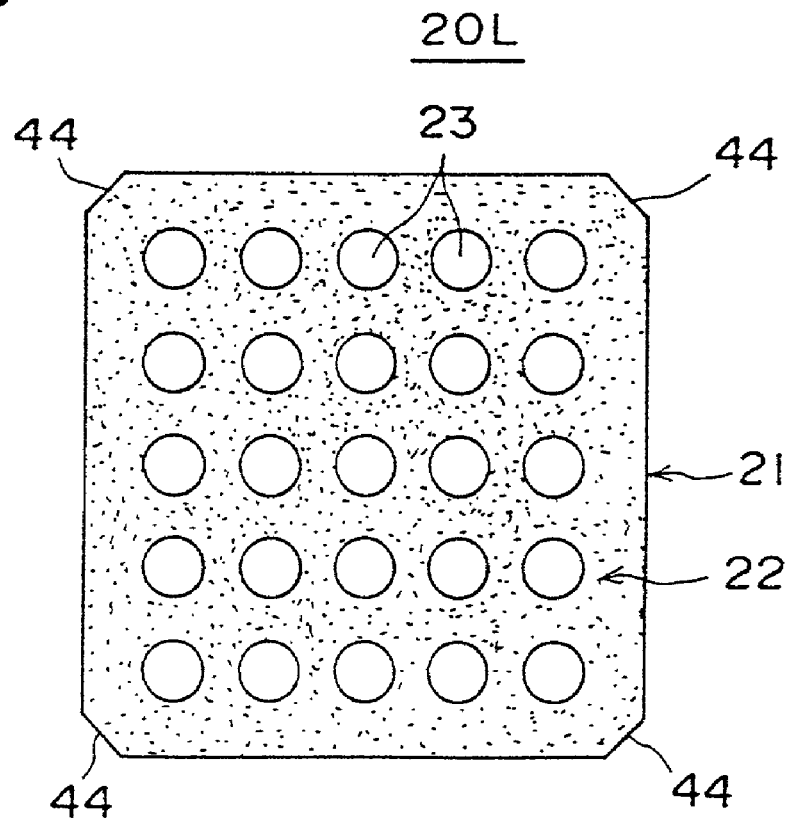

FIGS. 29A and 29B show the construction of a semiconductor device 20L according to a twenty-fourth embodiment of the present invention respectively in a side view and a plan view, wherein those parts corresponding to the parts described previously are designated by the same reference numerals and the description thereof will be omitted.

Figure 1:
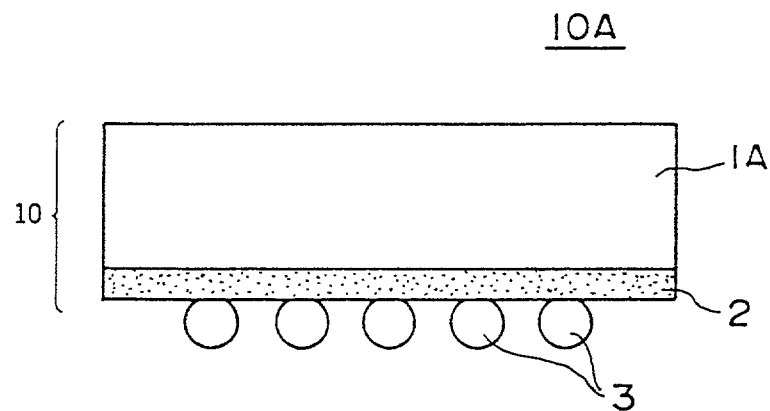
FIG. 1 is a diagram showing the construction of a conventional semiconductor device.
Figure 2:
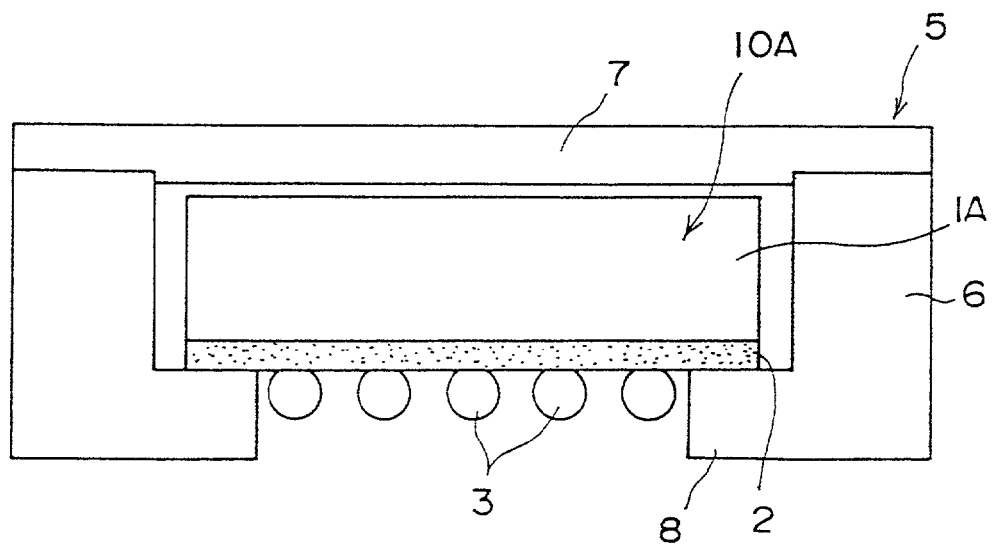
FIG. 2 is a diagram showing an example of a transportation tray used conventionally for carrying a semiconductor device.
Figure 3:
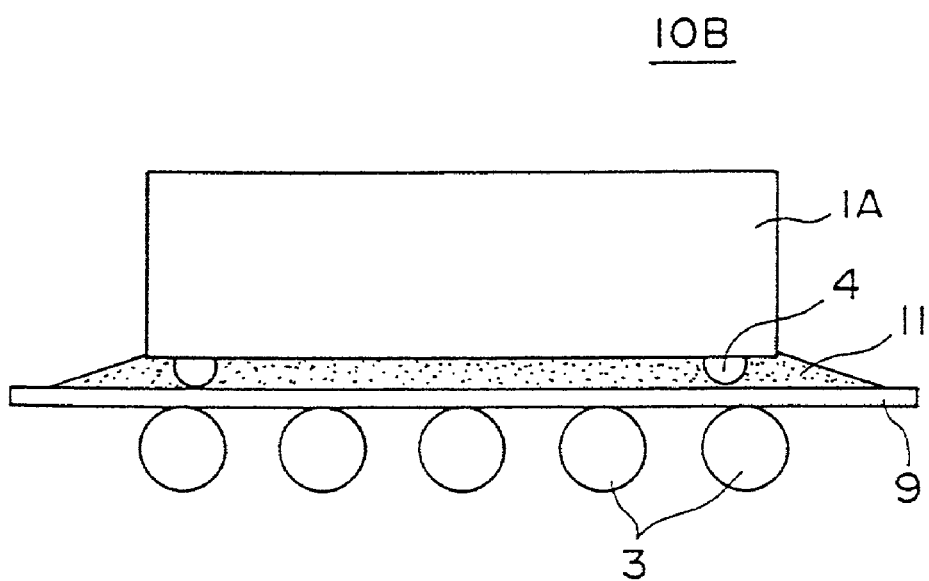
FIG. 3 is a diagram showing the construction of another conventional semiconductor device.
Figure 4:
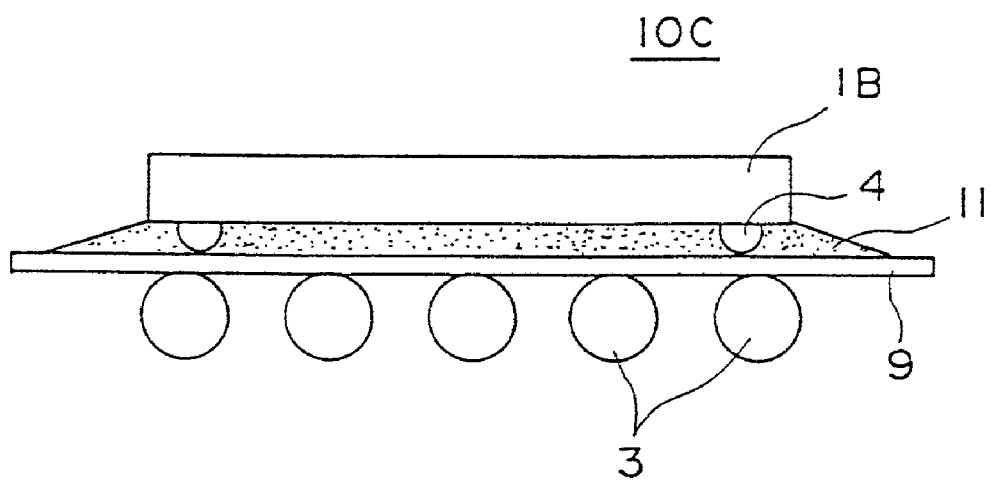
FIG. 4 is a diagram showing the construction of a further conventional semiconductor device.
Figure 5A:
FIGS. 5A–5D are diagrams showing a conventional process of forming a semiconductor substrate.
Figure 5B:
Figure 5C:
Figure 5D:
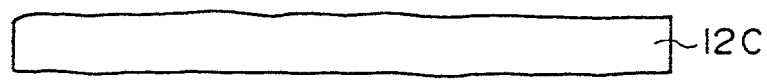

Referring to FIGS. 29A and 29B, the semiconductor device 20L has a construction similar to that of the conventional semiconductor device 10A explained with reference to FIG. 1 except that a chamfer surface 44 is formed on each of the four corners of the semiconductor chip 21 such that the chamfer surface 44 extends perpendicularly to the semiconductor chip 21.

By forming the chamfer surface 44 on the semiconductor chip 21, the semiconductor device 20L of the present embodiment becomes substantially invulnerable against external shock or stress which tends to concentrate to the four corners of the semiconductor chip 21. Thereby, the reliability of the semiconductor device 20L is improved substantially. It should be noted that the chamfer surface 44 is not limited to a flat surface but a curved surface or a stepped surface may be used.

[Twenty-Fifth Embodiment]

Figure 30A:
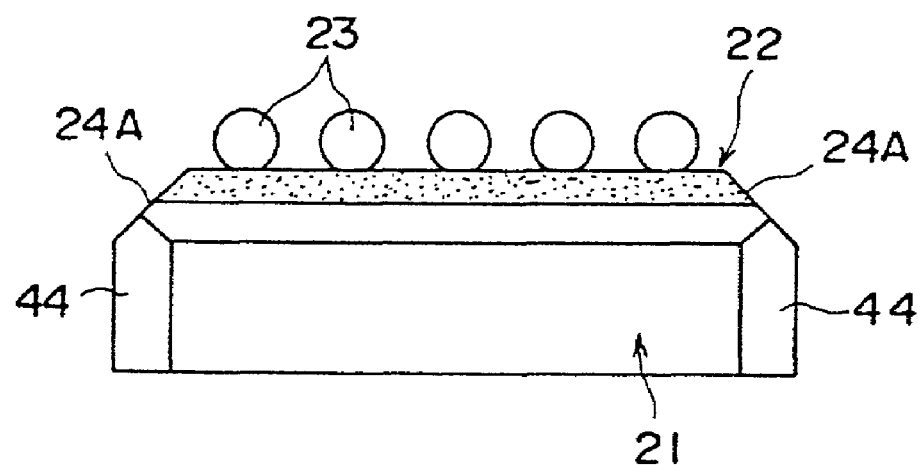
FIGS. 30A and 30B are diagrams showing the construction of a semiconductor device according to a twenty-fifth embodiment of the present invention.
Figure 30B:
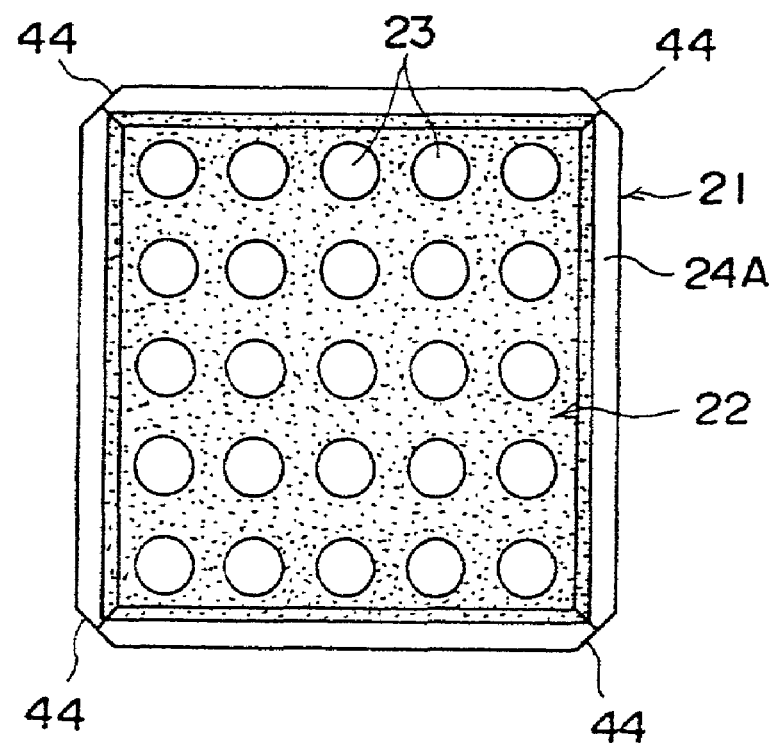

FIGS. 30A and 30B show the construction of a semiconductor device 20M according to a twenty-fifth embodiment of the present invention respectively in a side view and a plan view, wherein those parts corresponding to the parts described previously are designated by the same reference numerals and the description thereof will be omitted.

Referring to FIGS. 30A and 30B, the semiconductor device 20M has a construction similar to that of the semiconductor device 20A except that the additional chamfer surface 44 is formed on each of the four corners of the semiconductor chip 21 such that the chamfer surface 44 extends perpendicularly to the semiconductor chip 21.

By forming the chamfer surface 44 on the semiconductor chip 21, the semiconductor device 20M of the present embodiment becomes substantially invulnerable against external shock or stress which tends to concentrate to the four corners of the semiconductor chip 21. Thereby, the reliability of the semiconductor device 20M is improved further. It should be noted that the chamfer surface 44 is not limited to a flat surface but a curved surface or a stepped surface may be used.

[Twenty-Sixth Embodiment]

Figure 31A:
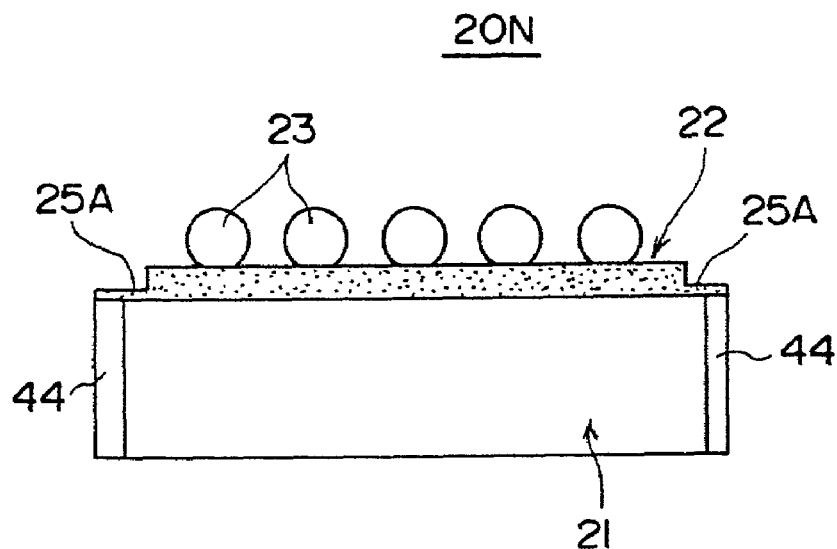
FIGS. 31A and 31B are diagrams showing the construction of a semiconductor device according to a twenty-sixth embodiment of the present invention.
Figure 31B:
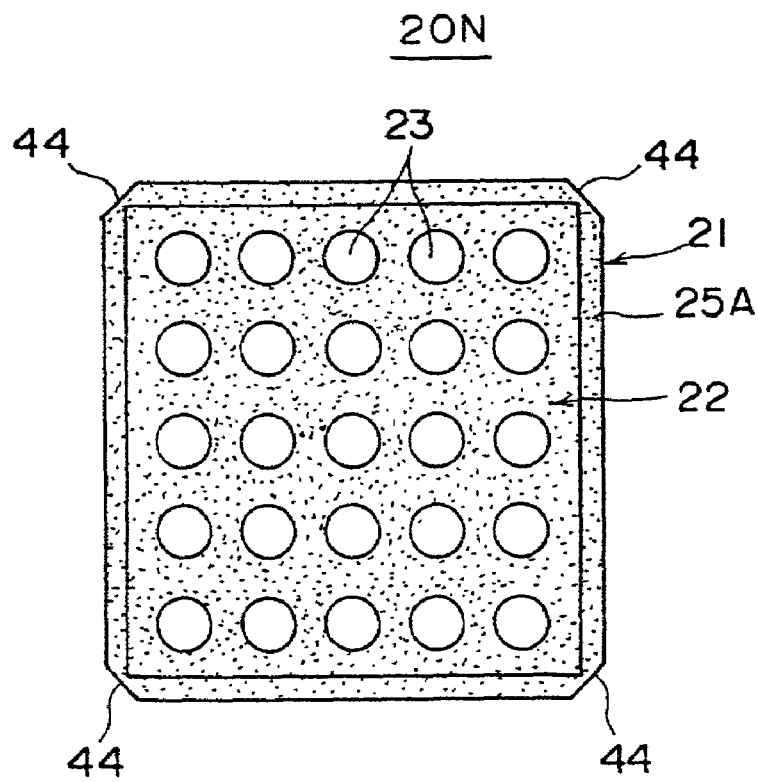

FIGS. 31A and 31B show the construction of a semiconductor device 20N according to a twenty-sixth embodiment of the present invention respectively in a side view and a plan view, wherein those parts corresponding to the parts described previously are designated by the same reference numerals and the description thereof will be omitted.

Referring to FIGS. 31A and 31B, the semiconductor device 20N has a construction similar to that of the semiconductor device 20B except that the additional chamfer surface 44 is formed on each of the four corners of the semiconductor chip 21 such that the chamfer surface 44 extends perpendicularly to the semiconductor chip 21.

By forming the chamfer surface 44 on the semiconductor chip 21, the semiconductor device 20N of the present embodiment becomes substantially invulnerable against external shock or stress which tends to concentrate to the four corners of the semiconductor chip 21. Thereby, the reliability of the semiconductor device 20N is improved further. It should be noted that the chamfer surface 44 is not limited to a flat surface but a curved surface or a stepped surface may be used.

[Twenty-Seven and Twenty-Eighth Embodiments]

Figure 32A:
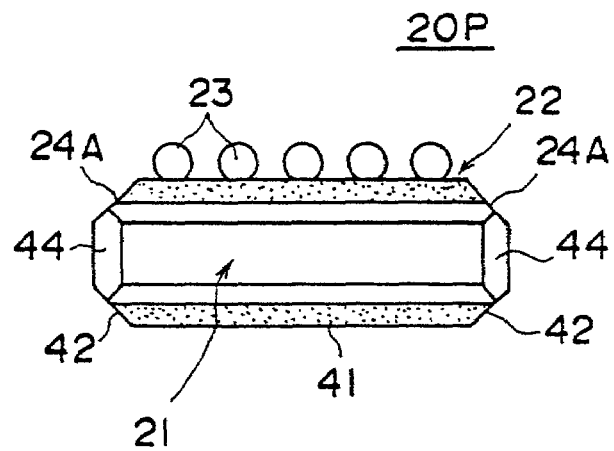
FIGS. 32A–32C are diagrams showing the construction of a semiconductor device according to twenty-seventh and twenty-eighth embodiments of the present invention.
Figure 32B:
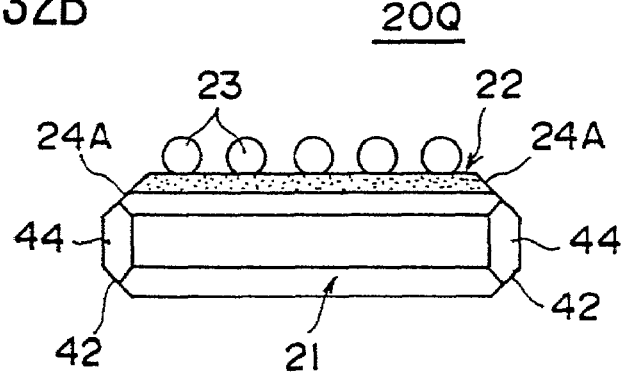
Figure 32C:
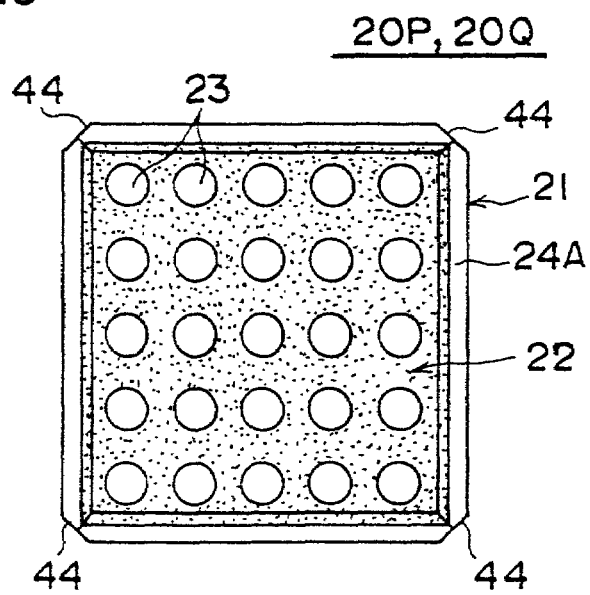

FIGS. 32A–32C show the construction of semiconductor devices 20P and 20Q according to twenty-seventh and twenty-eighth embodiments of the present invention, wherein FIG. 32A shows the semiconductor device 20P in a side view and FIG. 32B shows the semiconductor device 20Q in a side view, while FIG. 32C shows any of the semiconductor devices 20P and 20Q in a plan view. In the drawings, those parts corresponding to the parts described previously are designated by the same reference numerals and the description thereof will be omitted.

Referring to FIGS. 32A and 32C, the semiconductor device 20P has a construction similar to that of the semiconductor device 20H of FIGS. 25A and 25B except that the additional chamfer surface 44 is formed on each of the four corners of the semiconductor chip 21 such that the chamfer surface 44 extends perpendicularly to the plane of the semiconductor chip 21.

By forming the chamfer surface 44 on the semiconductor chip 21, the semiconductor device 20P of the present embodiment becomes substantially invulnerable against external shock or stress which tends to concentrate to the four corners of the semiconductor chip 21. Thereby, the reliability of the semiconductor device 20P is improved further.

Referring to FIGS. 32B and 32C, the semiconductor device 20Q has a construction similar to that of the semiconductor device 20J of FIGS. 27A and 27B except that the additional chamfer surface 44 is formed on each of the four corners of the semiconductor chip 21 such that the chamfer surface 44 extends perpendicularly to the plane of the semiconductor chip 21.

By forming the chamfer surface 44 on the semiconductor chip 21, the semiconductor device 20Q of the present embodiment-becomes substantially invulnerable against external shock or stress which tends to concentrate to the four corners of the semiconductor chip 21. Thereby, the reliability of the semiconductor device 20Q is improved further. It should be noted that the chamfer surface 44 is not limited to a flat surface but a curved surface or a stepped surface may be used.

[Twenty-Ninth Embodiment]

Figure 33:
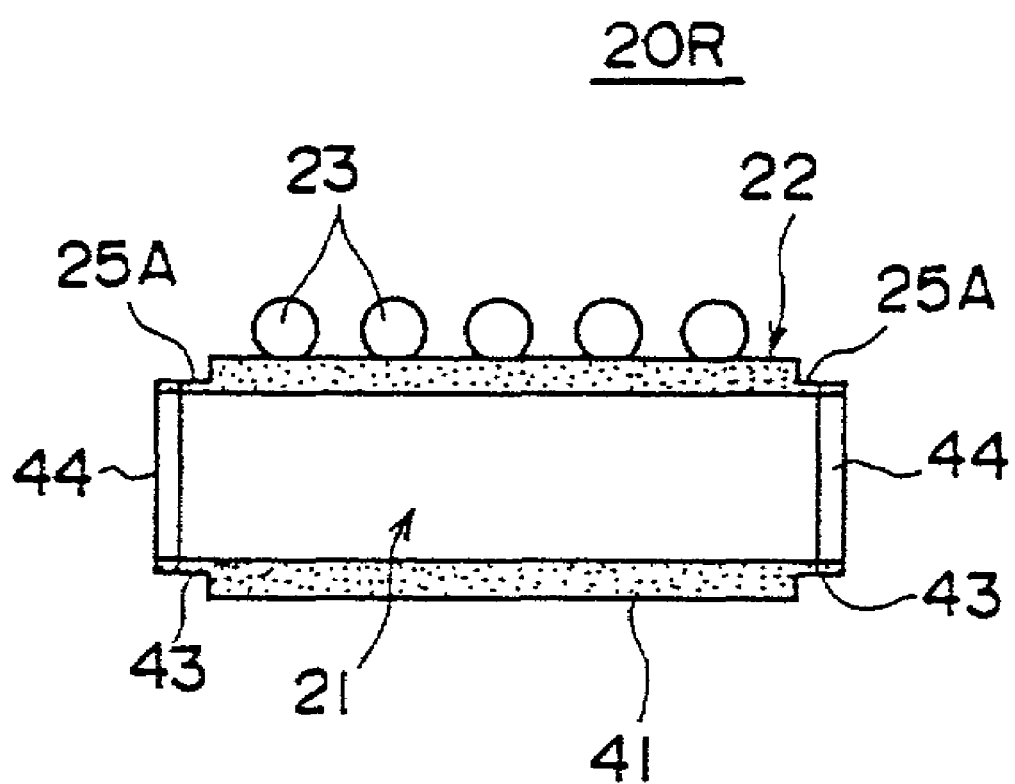
FIG. 33 is a diagram showing the construction of a semiconductor device according to a twenty-ninth embodiment of the present invention.

FIG. 33 shows the construction of a semiconductor device 20R according to a twenty-ninth embodiment of the present invention, wherein those parts corresponding to the parts described previously are designated by the same reference numerals and the description thereof will be omitted.

Referring to FIG. 33, the semiconductor device 20R has a construction similar to that of the semiconductor device 20I explained with reference to FIGS. 26A and 26B, except that the semiconductor device 20R includes the additional chamfer surface 44 on each of the four corners of the semiconductor chip 21. Similarly as before, the additional chamfer surface 44 extends perpendicularly to the plane or principal surface of the semiconductor chip 21.

By forming the chamfer surface 44 on the semiconductor chip 21, the semiconductor device 20R of the present embodiment becomes substantially invulnerable against external shock or stress which tends to concentrate to the four corners of the semiconductor chip 21. Thereby, the reliability of the semiconductor device 20R is improved further. It should be noted that the chamfer surface 44 is not limited to a flat surface but a curved surface or a stepped surface may be used.

[Thirtieth Embodiment]

Figure 34A:
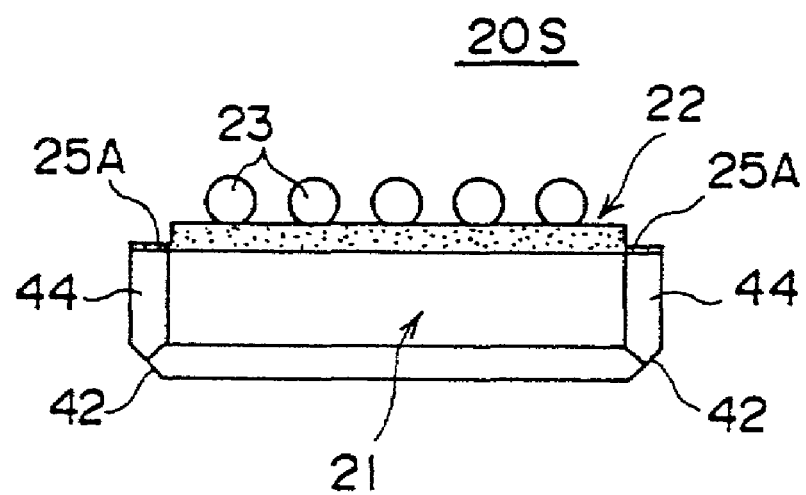
FIGS. 34A and 34B are diagrams showing the construction of a semiconductor device according to a thirtieth embodiment of the present invention.
Figure 34B:
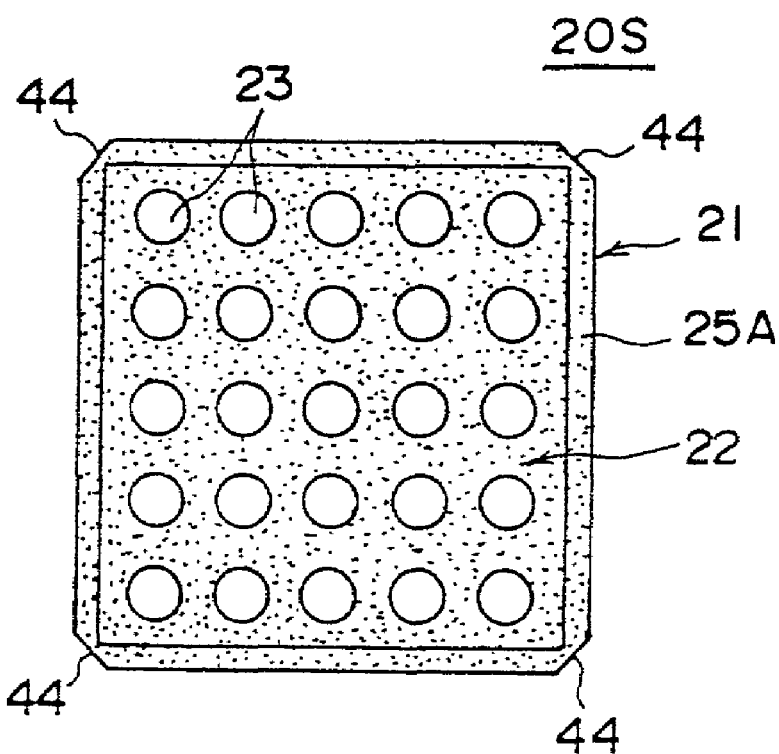

FIGS. 34A and 34B show the construction of a semiconductor device 20S according to a thirtieth embodiment of the present invention respectively in a side view and a plan view, wherein those parts corresponding to the parts described previously are designated by the same reference numerals and the description thereof will be omitted.

Referring to FIGS. 34A and 34B, the semiconductor device 20S has a construction similar to that of the semiconductor device 20K explained with reference to FIG. 28, except that the semiconductor device 20S includes the additional chamfer surface 44 on each of the four corners of the semiconductor chip 21. Similarly as before, the additional chamfer surface 44 extends perpendicularly to the plane or principal surface of the semiconductor chip 21.

By forming the chamfer surface 44 on the semiconductor chip 21, the semiconductor device 20S of the present embodiment becomes substantially invulnerable against external shock or stress which tends to concentrate to the four corners of the semiconductor chip 21. Thereby, the reliability of the semiconductor device 20S is improved further. It should be noted that the chamfer surface 44 is not limited to a flat surface but a curved surface or a stepped surface may be used.

[Thirty-First Embodiment]

Next, a fabrication process of any of the semiconductor devices 20L–20S will be described according to a thirty-first embodiment of the present invention with reference to FIG. 35 and further with reference to FIGS. 36A–36C.

Figure 35:
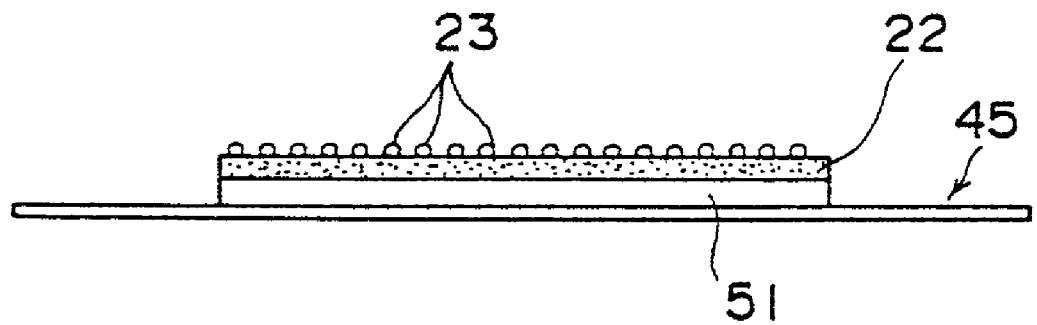
FIG. 35 is a diagram showing the fabrication process of a semiconductor device according to a thirty-first embodiment of the present invention.

Referring to FIG. 35, the semiconductor wafer 51 is adhered to a set film 45 on a stage of a dicing machine (not illustrated) after the monolithic electronic circuits are formed thereon and the top surface of the semiconductor wafer 51 covered by the resin layer 22.

Figures 36A, 36B, 36C:
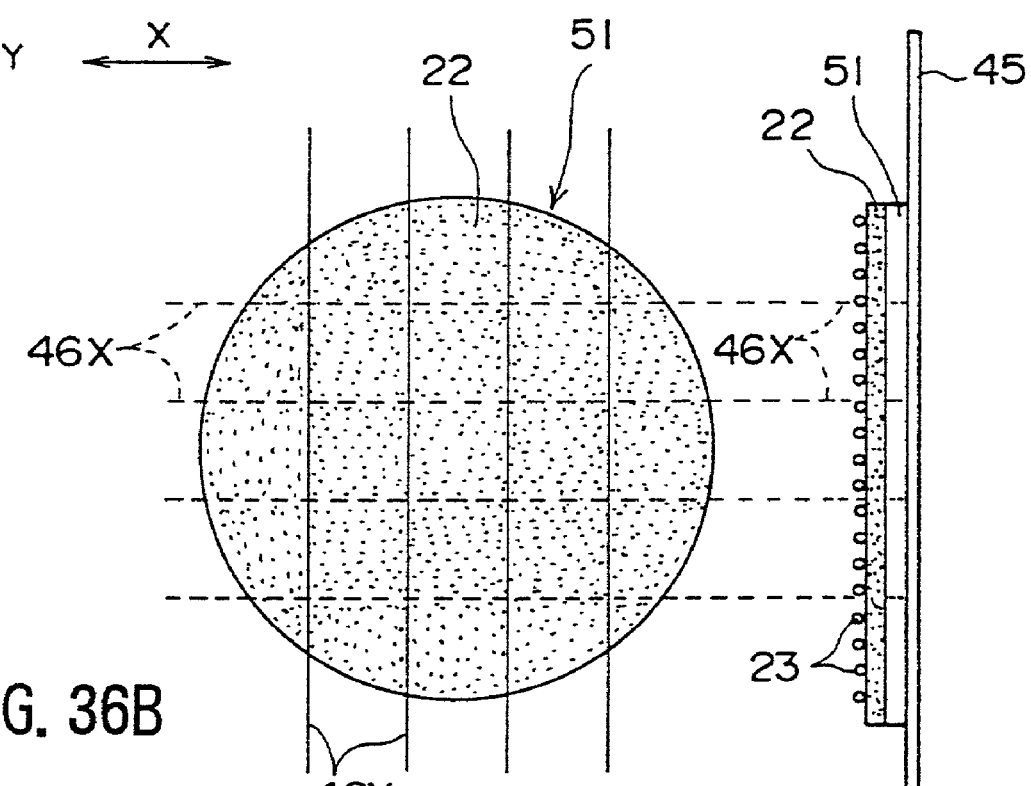
FIGS. 36A–36C are further diagrams showing the fabrication process of the thirty-first embodiment of the present invention.

Next, in the step of FIGS. 36A–36C, the wafer 51 is subjected to a dicing process along dicing lines 46X extending in the X-direction and further along dicing lines 46Y extending in the Y-direction, wherein the first dicing process conducted along the dicing lines 46X is carried out such that only the resin layer 22 and the semiconductor wafer 51 are cut by the dicing saw while the set film 45 is maintained substantially intact. Thus, after the foregoing first dicing process in the X-direction, the semiconductor wafer 51 maintains the integral state on the set film 45.

Figure 37:
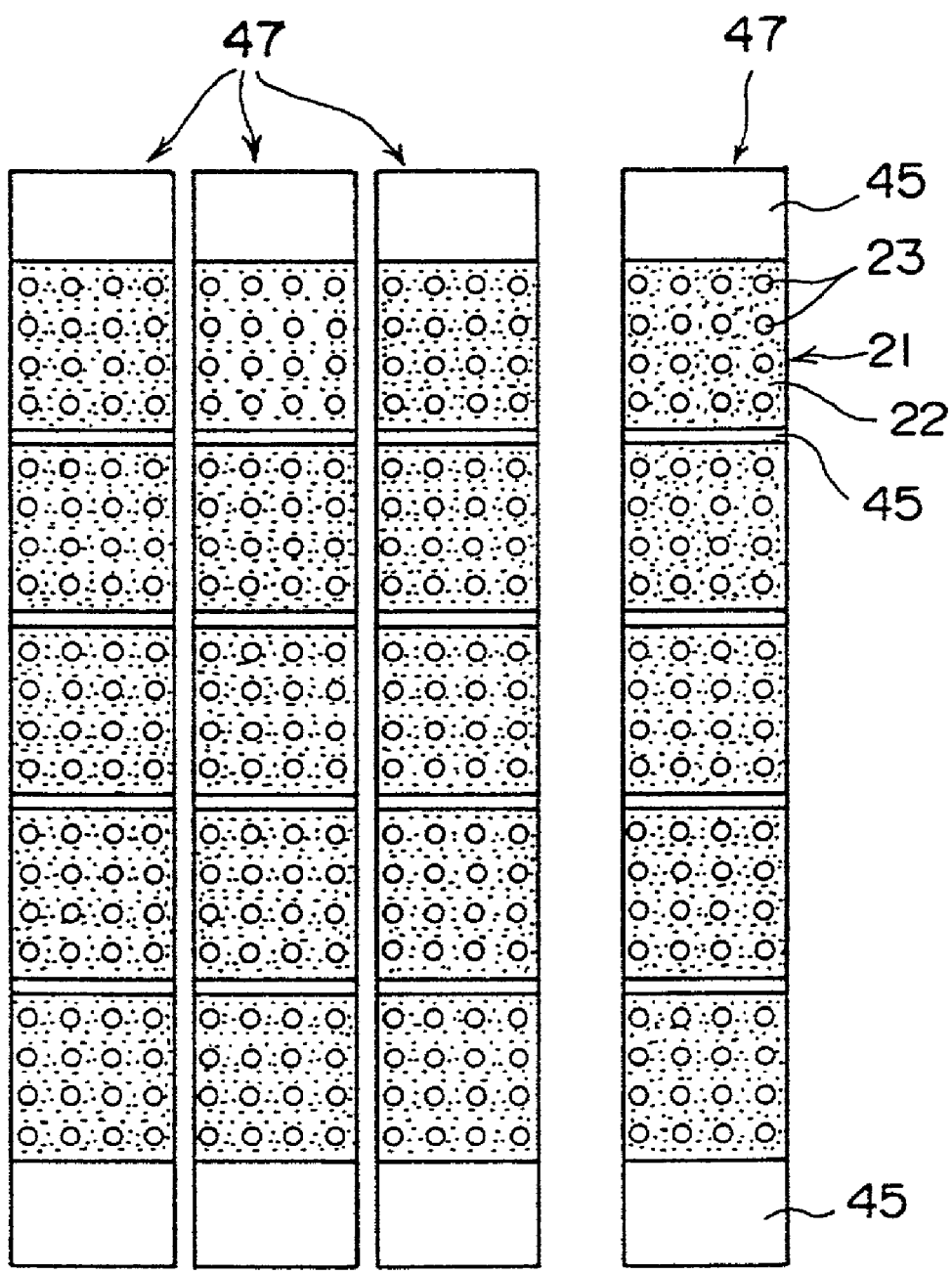
FIG. 37 is a further diagram showing the fabrication process of the thirty-first embodiment of the present invention.

Next, the semiconductor wafer 51 is subjected to the dicing process in the Y-direction along the dicing lines 46Y such that not only the resin layer 22 or the semiconductor wafer 51 but also the set film 45 is sawed by the dicing saw. As a result of such a second dicing process, a number of strips 47 are obtained as indicated in FIG. 37, wherein each strip 47 includes a number of semiconductor devices 22 in the state that the semiconductor chips 21 are adhered to the strip-shaped film 45.

Figure 38A:
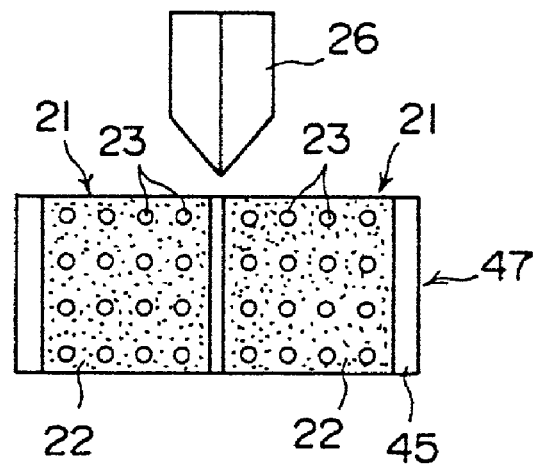
FIGS. 38A–38C are further diagrams showing the fabrication process of the thirty-first embodiment of the present invention.
Figure 38B:
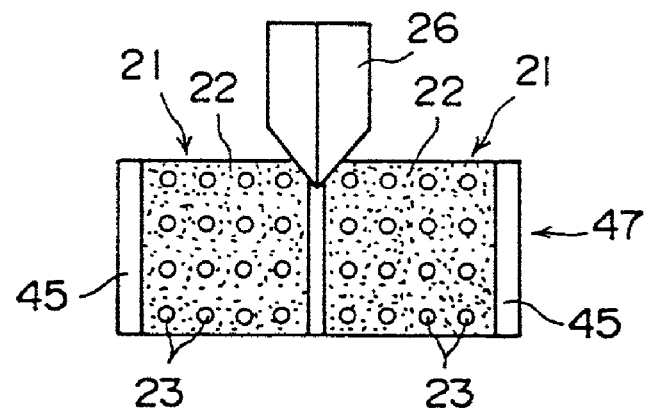
Figure 38C:
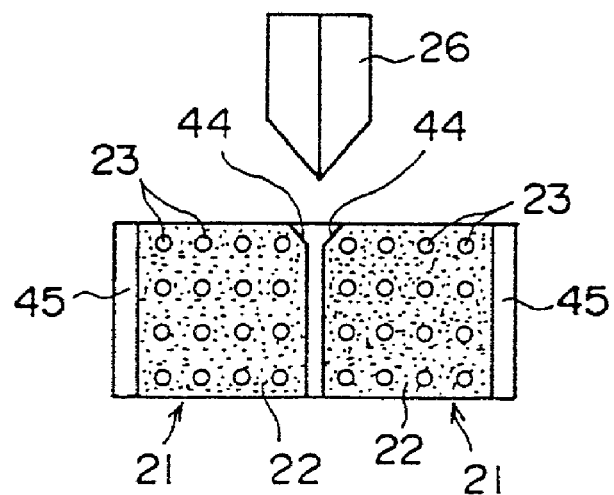

In each of the strips 47, it should be noted that the side walls of the semiconductor chip 21 are exposed at both lateral edges of the strip 47. Thus, the chamfer surface 44 is formed by applying the V-shaped saw blade 26 to the side walls of the semiconductor chips 21 from the lateral direction as indicated in FIGS. 38A–38C, wherein it can be seen that the saw blade 26 is pointed to the dicing groove formed in the first dicing process conducted in the X-direction between a pair of semiconductor chips 21 located adjacent with each other on the set film 45 as indicated in FIG. 38A. As a result of the process of FIG. 38B conducted subsequently to the step of FIG. 38A, a pair of chamfer surfaces 44 are formed simultaneously on the foregoing adjacent semiconductor chips 21 as indicated in FIG. 38C.

After forming the chamfer surfaces 44 as indicted in FIG. 38C, the set film 45 is removed.

[Thirty-Second Embodiment]

Figure 39:
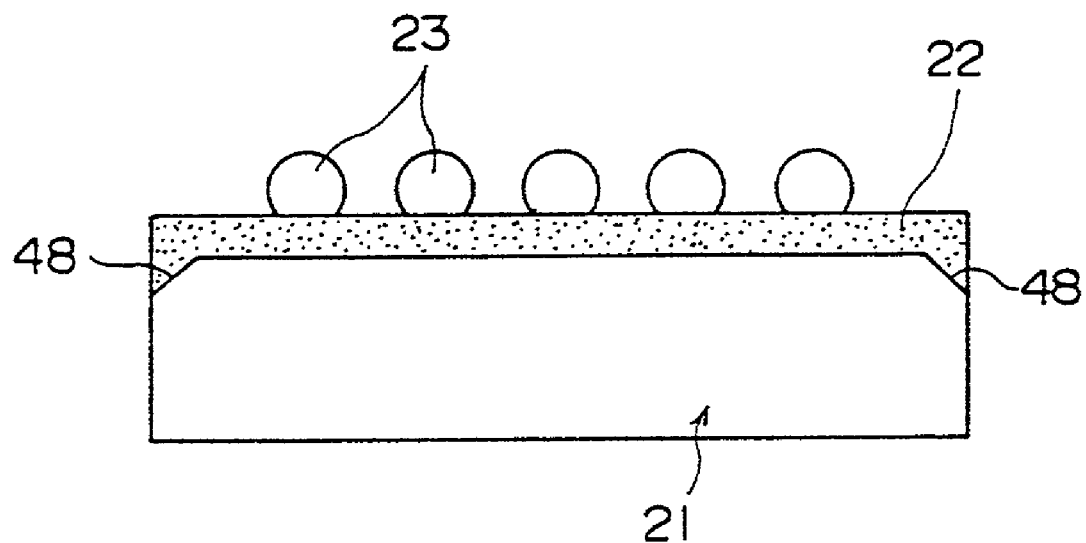
FIG. 39 is a diagram showing the construction of a semiconductor device according to a thirty-second embodiment of the present invention.

FIG. 39 shows the construction of a semiconductor device 20T according to a thirty-second embodiment of the present invention, wherein those parts corresponding to the parts described previously are designated by the same reference numerals and the description thereof will be omitted.

Referring to FIG. 39, the semiconductor device 20T includes the resin layer 22 on the semiconductor chip 21 wherein it should be noted that the semiconductor chip 21 carries a chamfer surface 48 along a top edge part and the resin layer 22 covers not only the top surface of the semiconductor chip 21 but also the foregoing chamfer surface 48. Similarly as before, the bump electrodes 23 on the top surface of the semiconductor chip 21 project beyond the resin layer 22.

In the semiconductor device 20T, the area of contact of the resin layer 22 with the semiconductor chip 21 is increased and the risk of the resin layer 22 peeling off from the semiconductor chip 21 is reduced. Thereby, the protection of the semiconductor device 20T by the resin layer 22 is improved.

[Thirty-Third Embodiment]

FIGS. 40A–40G are diagrams showing the fabrication process of the semiconductor device 20T according to a thirty-third embodiment of the present invention, wherein those parts corresponding to the parts described previously are designated by the same reference numerals and the description thereof will be omitted.

Figure 40A:
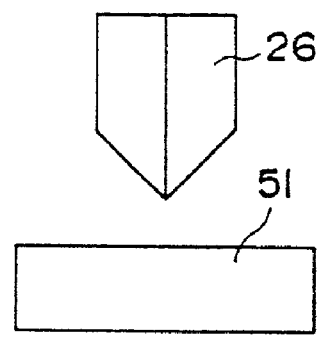
FIGS. 40A–40G are diagrams showing the fabrication process of a semiconductor device according to a thirty-third embodiment of the present invention.
Figure 40E:
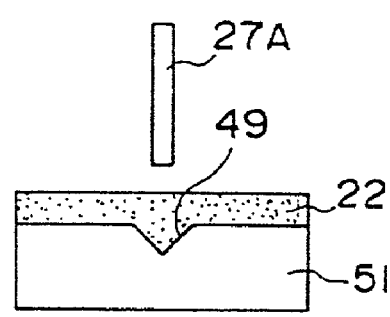
Figure 40B:
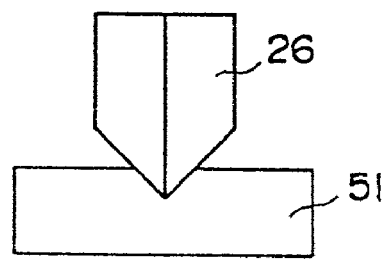
Figure 40F:
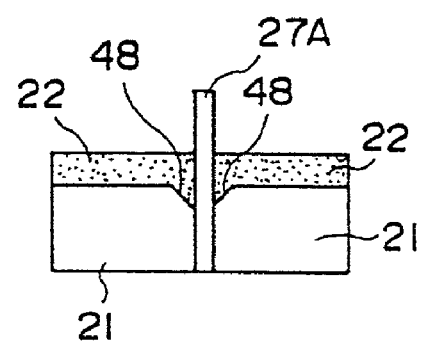
Figure 40C:
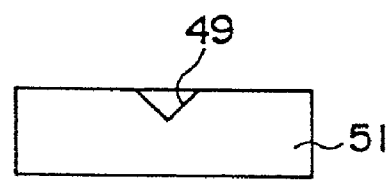
Figure 40G:
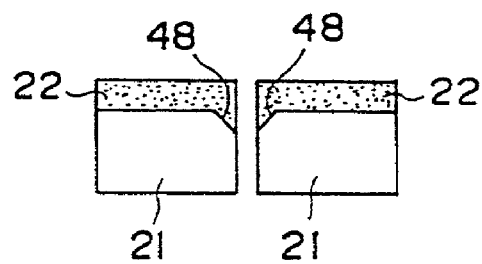

Referring to FIG. 40A, a number of monolithic electronic circuits (not shown) are formed on the semiconductor wafer 51 in correspondence to individual semiconductor integrated circuits to be formed, and the saw blade 26 having the V-shaped cutting edge is applied to the semiconductor wafer 51 in the step of FIG. 40B, to form a V-shaped groove 49 defined by a pair of surfaces corresponding to the chamfer surface 48 the semiconductor device 20T as indicated in FIG. 40C.

Figure 40D:
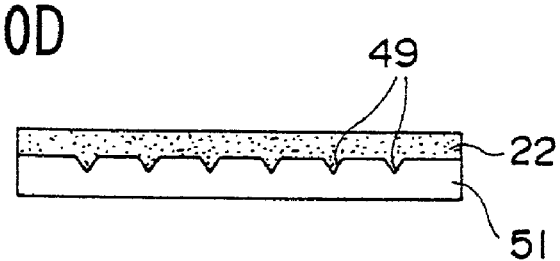

Next, the resin layer 22 is applied to the semiconductor wafer 51 in the step of FIG. 40D so as to fill the foregoing V-shaped groove 49 and so as to protect the monolithic electronic circuits, and the saw blade 27A having a flat cutting edge surface is applied in the step of FIG. 40E in alignment with the center of the V-shaped groove 49. By dicing the wafer 51 in the step of FIG. 40F, the semiconductor wafer 51 is divided into a number of semiconductor devices each having the structure of the semiconductor device 20T. Similarly as before, the saw blade 27A has a blade width smaller than a width of the V-shaped groove 49 formed by the saw blade 26.

By forming the semiconductor device 20T according to the process of the present embodiment, a large number of the semiconductor devices 20T are obtained simultaneously and the efficiency of production of the semiconductor device is improved substantially. As the depth of cut made by the saw blade 26 is limited, the wear of the saw blade 26 is minimized.

[Thirty-Fourth Embodiment]

Figure 41:
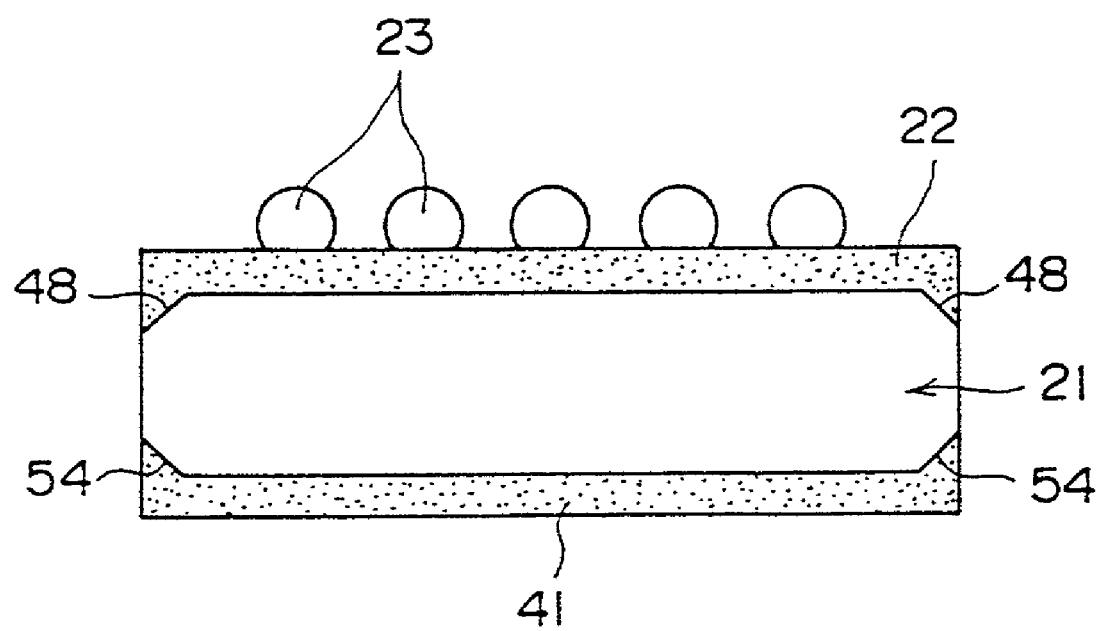
FIG. 41 is a diagram showing the construction of a semiconductor device according to a thirty-fourth embodiment of the present invention.

FIG. 41 is shows the construction of a semiconductor device 20U according to a thirty-fourth embodiment of the present invention, wherein those parts corresponding to-the parts described previously are designated by the same reference numerals and the description thereof will be omitted.

Referring to FIG. 41, the semiconductor device 34 has a construction similar to that of the semiconductor device 20T of the previous embodiment except that the semiconductor chip 21 is formed with a chamfer surface 54 along the bottom peripheral edge thereof and the resin layer 41 is provided on the bottom surface of the semiconductor chip 41 so as to cover the foregoing chamfer surface 54.

According to the present embodiment, the semiconductor chip 21 is protected not only on the top surface but also on the bottom surface and the risk of the semiconductor device 20U being damaged during the manufacturing process of an electronic apparatus is reduced substantially. As the bottom resin layer 41 covers the chamfer surface 54, the resin layer 41 is held stably and does not peel off easily.

In the semiconductor device 34 of the present invention, it should be noted that the chamfer surfaces 48 and 49 are not limited to a flat surface as illustrated but may be formed of a curved surface or a stepped surface. In such a case, an anchoring effect is obtained for the resin layer 22 or 41 and the adhesion of the resin layer is improved.

[Thirty-Fifth Embodiment]

FIGS. 42A–42G show the fabrication process of a semiconductor device according to a thirty-fifth embodiment of the present invention, wherein those parts corresponding to the parts described previously are designated by the same reference numerals and the description thereof will be omitted.

Figure 42A:
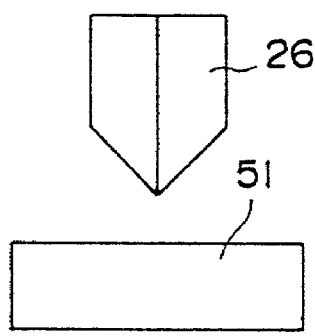
FIGS. 42A–42G are diagrams showing the fabrication process of a semiconductor device according to a thirty-fifth embodiment of the present invention.
Figure 42B:
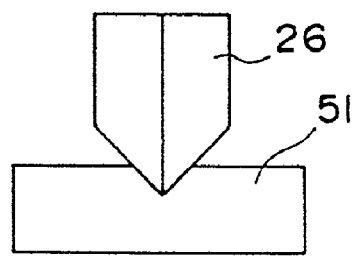

Referring to FIG. 42A, the saw blade 26 having the V-shaped blade edge surface is applied to the semiconductor wafer 51 and a V-shaped groove 49 is formed on the top surface of the semiconductor wafer 51 along a dicing line as indicated in FIG. 42B.

Figure 42C:
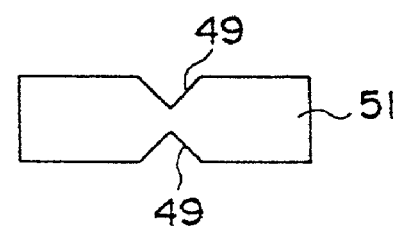

Next, in the step of FIG. 42C, the same saw blade 26 is applied to the bottom surface of the semiconductor wafer 51 and a V-shaped groove 49 is formed on the bottom surface of the wafer 51 such that the V-shaped groove 49 opposes the V-shaped groove 49 on the top surface along the dicing line.

Figure 42D:
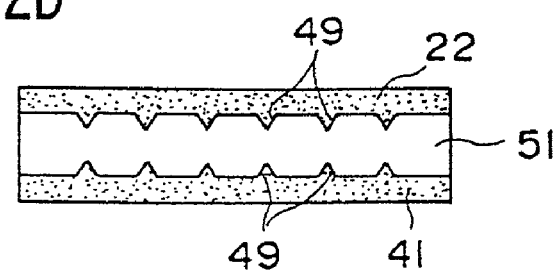

Next, in the step of FIG. 42D, the resin layer 22 is applied to the top surface of the semiconductor wafer 51 so as to fill the V-shaped grooves 49 thereon. Further, the resin layer 41 is applied to the bottom surface of the semiconductor wafer so as to fill the V-shaped grooves 49 thereon.

Figure 42E:
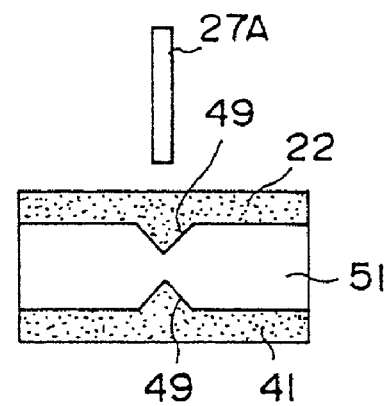
Figure 42F:
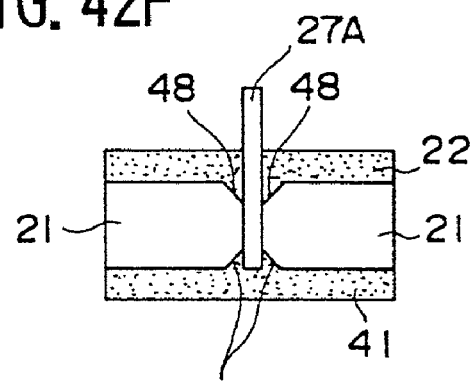
Figure 42G:
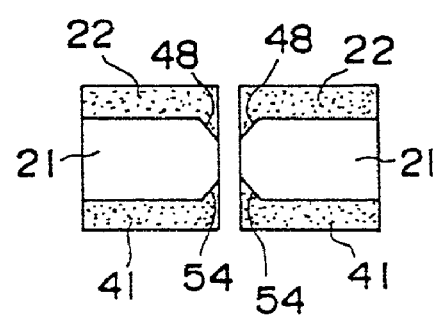

Next, in the step of FIG. 42E, the saw blade 27A having a reduced blade width is applied to the semiconductor wafer 51 in correspondence to the V-shaped groove 49 on the top surface of the wafer 51, and the semiconductor wafer 51 is diced in the step of FIG. 42F by causing the saw blade 27A to cut into the wafer 51 through the resin layer 22 and further into the resin layer 41. As a result of the dicing process of FIG. 42F, the semiconductor wafer 51 is divided into individual semiconductor devices 20U each including a semiconductor chip 21.

According to the fabrication process of the present embodiment, a large number of the semiconductor devices 20U of FIG. 41 are mass produced while minimizing the wear of the saw blade 26, similarly to the preceding embodiments in view of the fact that the saw blade 26 cuts into the semiconductor wafer 51 only in a limited depth. Further, the throughput of production of the semiconductor devices 20U is reduced.

[Thirty-Sixth Embodiment]

Figure 43A:
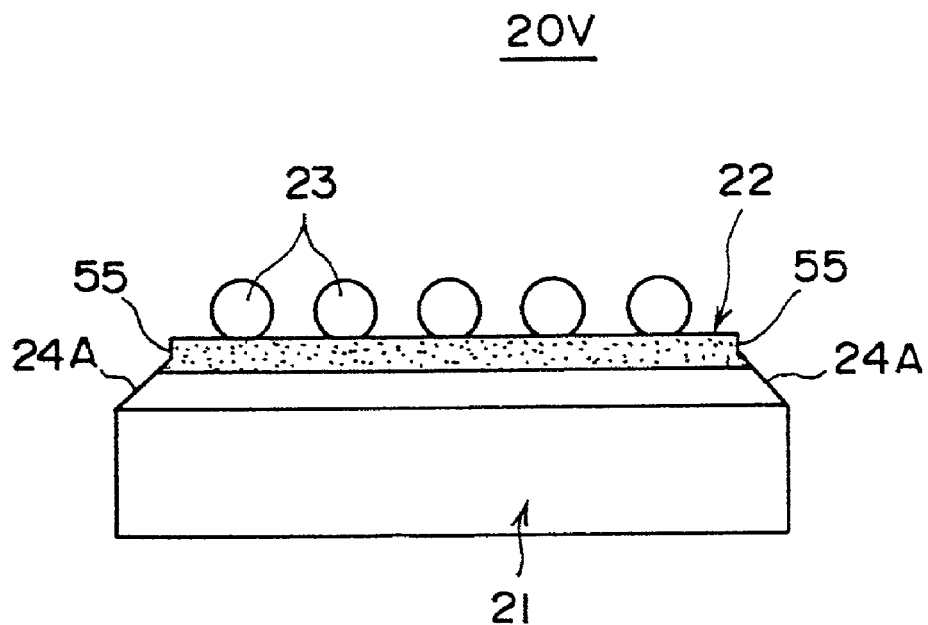
FIGS. 43A and 43B are diagrams showing the construction of a semiconductor device according to a thirty-sixth embodiment of the present invention.
Figure 43B:
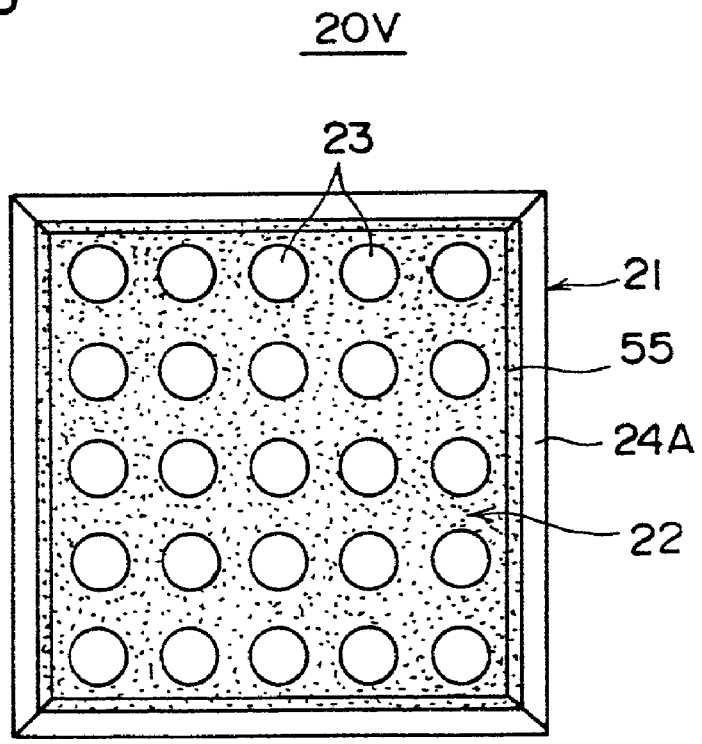

FIGS. 43A and 43B are diagrams showing the construction of a semiconductor device 20V according to a thirty-sixth embodiment of the present invention, wherein those parts corresponding to the parts described previously are designated by the same reference numerals and the description thereof will be omitted.

Referring to FIGS. 43A and 43B, the semiconductor device 20V carries the resin layer 22 on the top surface of the semiconductor chip 21 on which the bump electrodes 23 are formed, wherein the semiconductor chip 21 is further formed with the chamfer surface 24A surrounding the semiconductor chip 21 laterally. The resin layer 22 is defined by a vertical side wall 55 inside the chamfer surface 24A, and the vertical side wall 55 extends straight in correspondence to the rectangular shape of the semiconductor chip 21.

By forming the vertical side wall 55 on the resin layer 22, the handler mechanism used for holding the semiconductor device 20V when assembling an electronic apparatus can hold the semiconductor device 20V easily. Similarly as before, the chamfer surface 24A dissipates the shock or stress applied to the semiconductor device 20V. In the present embodiment, it is also possible to form the chamfer surface 24A inside the resin layer 22 instead of forming in the chamfer surface 24A to cut the semiconductor chip 21 and a marginal part of the resin layer 22.

[Thirty-Seventh Embodiment]

FIGS. 44A–44D are diagrams showing the fabrication process of the semiconductor device 20V according to a thirty-seventh embodiment of the present invention, wherein those parts corresponding to the parts described previously are designated by the same reference numerals and the description thereof will be omitted.

Figure 44A:
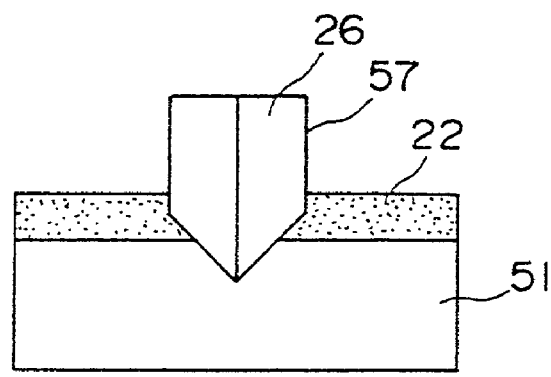
FIGS. 44A–44D are diagrams showing the fabrication process of a semiconductor device according to a thirty-seventh embodiment of the present invention.

Referring to FIG. 44A, the V-shaped saw blade 26 is applied to the resin layer 22 covering the semiconductor wafer 51 with a depth such that a flat side wall of the saw blade 26 cuts into the resin layer 22. In the step of FIG. 44A, the V-shaped tip end of the saw blade 26 reaches the semiconductor wafer 51, and a V-shaped groove 56 defined by a pair of vertical side walls 55 is formed as indicated in FIG. 44B.

Figure 44B:
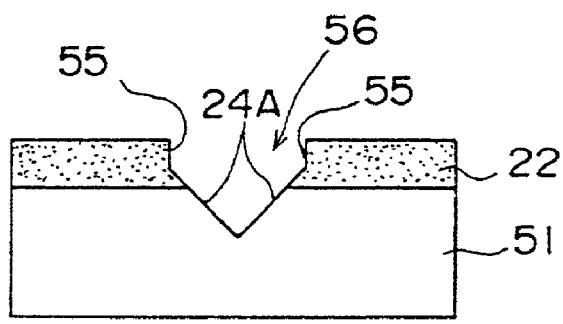
Figure 44C:
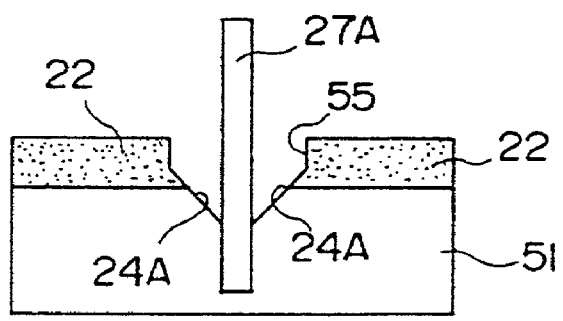
Figure 44D:
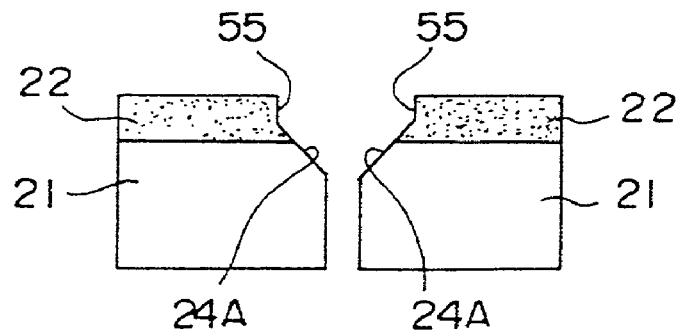

Next, in the step of FIG. 44C, the saw blade 27A having a reduced blade width is applied to the semiconductor wafer 51 such that the blade 27A cuts into the wafer 51 in correspondence to the center of the V-shaped groove 56.

As a result of the dicing process conducted by the saw blade 27A in the step of FIG. 44A, the semiconductor wafer 51 is divided into individual semiconductor chips 21 each corresponding to a semiconductor device 20V.

According to the present embodiment, the width of the V-shaped groove 56 formed in the step of FIG. 44B is limited and the time needed for forming the V-shaped groove 56 is reduced substantially as compared with the case of forming a width V-shaped groove, lacking the vertical side walls 55, by a wide V-shaped saw blade. Associated with the reduction of time for grinding the V-shaped groove 56, the wear of the saw blade 56 is minimized and the lifetime of the saw blade 56 is maximized. Further, the cost of the saw blade 56 having a narrower blade width is substantially lower than the wide V-shaped groove used for forming the foregoing wide V-shaped groove. In the semiconductor device 20V of the previous embodiment, it is sufficient to form the chamfer surface 24A only partially on the surrounding rim edge for achieving the desired dissipation of the shock or stress.

Further, the present invention is not limited to the embodiments described heretofore, but various variations and modifications may be made without departing from the scope of the invention.

What is claimed is:

1. A method of fabricating a semiconductor device, comprising the steps of:
    forming a resin layer on a principal surface of a semiconductor substrate;
    grooving said resin layer along a dicing line on said semiconductor substrate to form a V-shaped groove having a substantially V-shaped cross-section such that said V-shaped groove reaches said semiconductor substrate; and
    dicing, after said step of grooving, said semiconductor substrate along said V-shaped groove by forming a dicing groove with a width smaller than a width of said V-shaped groove.

2. A method as claimed in claim 1, wherein said step of grooving is conducted along said dicing line for an entire length thereof on said substrate.

3. A method as claimed in claim 1, wherein said step of grooving is conducted in the vicinity of cross points of mutually crossing dicing lines to form said V-shaped groove in the form of isolated cross-mark patterns.

4. A method as claimed in claim 1, further comprising, after said step of forming said resin layer but before said step of grooving said resin layer, the step of reducing a thickness of said semiconductor substrate by grinding a rear surface of said semiconductor substrate.

5. A method of fabricating a semiconductor device, comprising the steps of:
    forming a resin layer on a principal surface of a semiconductor substrate;
    dicing said semiconductor substrate along a dicing line by forming a dicing groove through said resin layer and through said semiconductor substrate; and
    grooving, after said step of dicing of said semiconductor substrate, said resin layer along said dicing line to form a V-shaped groove having a substantially V-shaped cross-section in said resin layer such that said V-shaped groove has a width larger than a width of said dicing groove and reaches said semiconductor substrate.

6. A method as claimed in claim 5, wherein said step of grooving is conducted along said dicing line for an entire length thereof on said substrate.

7. A method as claimed in claim 5, wherein said step of grooving is conducted in the vicinity of cross points of mutually crossing dicing lines to form said V-shaped groove in the form of isolated cross-mark patterns.

8. A method as claimed in claim 5, wherein said semiconductor substrate is mounted on a dicing apparatus by an adhesive tape.

9. A method as claimed in claim 5, further comprising, after said step of forming said resin layer but before said step of grooving, the step of reducing a thickness of said substrate.

10. A method as claimed in claim 1, wherein said step of grooving is conducted by a saw blade having a V-shaped saw blade edge between a pair of mutually parallel lateral surfaces, with such a depth that said V-shaped groove formed by said V-shaped saw blade has a pair of lateral surfaces extending substantially perpendicularly to a principal surface of said semiconductor substrate in continuation to a V-shaped bottom of said V-shaped groove, and such that said lateral surfaces of said saw blade engage said side walls of said V-shaped groove.

* * * * *